(12) United States Patent
Shao et al.

(10) Patent No.: US 12,402,294 B2
(45) Date of Patent: Aug. 26, 2025

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 553 days.

(21) Appl. No.: 17/899,622

(22) Filed: Aug. 31, 2022

(65) Prior Publication Data

US 2023/0422465 A1    Dec. 28, 2023

Related U.S. Application Data

(63) Continuation of application No. PCT/CN2022/104125, filed on Jul. 6, 2022.

(30) Foreign Application Priority Data

Jun. 24, 2022  (CN) .......................... 202210723869.3

(51) Int. Cl.
    *H10B 12/00*    (2023.01)
(52) U.S. Cl.
    CPC ............. *H10B 12/03* (2023.02); *H10B 12/05* (2023.02); *H10B 12/30* (2023.02)
(58) Field of Classification Search
    CPC ........ H10B 12/00; H10B 12/03; H10B 12/05; H10B 12/30
    See application file for complete search history.

(56) References Cited

U.S. PATENT DOCUMENTS

| 11,094,699 B1 | 8/2021 | Brewer et al. |
| 2006/0081556 A1* | 4/2006 | Cline .................. H01L 21/3086 |
| | | 257/E21.252 |

(Continued)

FOREIGN PATENT DOCUMENTS

| CN | 110957303 A | 4/2020 |
| CN | 112216318 A | 1/2021 |

(Continued)

OTHER PUBLICATIONS

ISA State Intellectual Property Office of the People's Republic of China, International Search Report Issued in Application No. PCT/CN2022/104125, Dec. 26, 2022, WIPO, 8 pages.

*Primary Examiner* — William B Partridge
*Assistant Examiner* — Felix B Andrews
(74) *Attorney, Agent, or Firm* — Kilpatrick Townsend & Stockton LLP

(57) ABSTRACT

Embodiments relate to a semiconductor structure and a fabrication method thereof. The method for fabricating a semiconductor structure includes: providing a substrate, where a semiconductor stacked structure formed by alternately stacking first semiconductor layers and second semiconductor layers is formed on the substrate; patterning the semiconductor stacked structure to form cell structures extending along a first direction and arranged at intervals; removing a part of the first semiconductor layers positioned in first regions in the cell structures, such that a part of the second semiconductor layers positioned in the first regions form capacitor support structures; and forming capacitors on exposed surfaces of the capacitor support structures, where the capacitors include first electrodes, dielectric layers and second electrodes sequentially stacked along a direction distant from the capacitor support structures; and all the (Continued)

capacitors in the first regions share the same second electrode.

12 Claims, 23 Drawing Sheets

(56) References Cited

U.S. PATENT DOCUMENTS

| | | | |
|---|---|---|---|
| 2020/0111793 A1* | 4/2020 | Kim | H10D 88/00 |
| 2020/0312951 A1 | 10/2020 | Xu et al. | |
| 2023/0320069 A1* | 10/2023 | Fulford | H10B 12/05 |
| | | | 257/296 |
| 2024/0063202 A1* | 2/2024 | Elsherbini | H01L 23/5385 |

FOREIGN PATENT DOCUMENTS

| | | | |
|---|---|---|---|
| CN | 114121819 A | 3/2022 | |
| CN | 114582809 A * | 6/2022 | H01L 27/10805 |

\* cited by examiner

| Form sources on a part of the second semiconductor layers positioned in at least one of the second regions, where the sources are correspondingly connected to the first electrodes | S500 |

| Form second isolation material layers, where the second isolation material layers cover the sources and fill the first openings and the first accommodating grooves | S600 |

Fig. 25

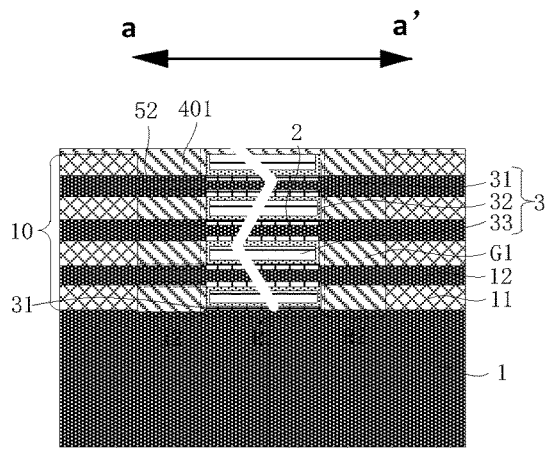

Fig. 26

| Remove a first part of the second semiconductor layers positioned in one of the second regions, such that one end of each of the capacitor support structures is suspended, and fourth openings are formed in the second semiconductor layers; and form sources on a second part of the second semiconductor layers positioned in other one of the second regions | S500' |

| Form third isolation material layers, where the third isolation material layers cover the sources and fill the first openings, the first accommodating grooves, and the fourth openings | S600' |

Fig. 27

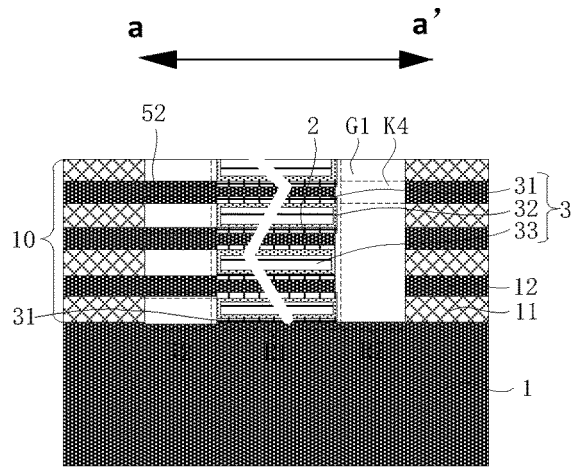
Fig. 28
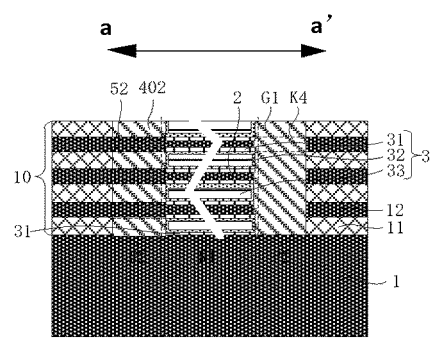
Fig. 29
Remove a part of the first semiconductor layers positioned in the third regions in the cell structures, such that a part of the second semiconductor layers positioned in the third regions form the drain regions, where the third region is positioned on a side of the second region facing away from the first region — S710
Form drains in the drain regions — S720
Fig. 30

| Remove a part of the first semiconductor layers positioned in the fourth regions in the cell structures, such that a part of the second semiconductor layers positioned in the fourth regions form channel pillars of transistors, where the fourth regions are positioned between the third regions and the second regions | — S810 |

| Form gates on the channel pillars | — S820 |

SEMICONDUCTOR STRUCTURE AND FABRICATION METHOD THEREOF

CROSS-REFERENCE TO RELATED APPLICATION

The present disclosure is a continuation of PCT/CN2022/104125, filed on Jul. 6, 2022, which claims priority to Chinese Patent Application No. 202210723869.3 titled "SEMICONDUCTOR STRUCTURE AND FABRICATION METHOD THEREOF" and filed to the State Intellectual Property Office on Jun. 24, 2022, the entire contents of which are incorporated herein by reference.

TECHNICAL FIELD

The present disclosure relates to the field of semiconductor integrated circuit technology, and more particularly, to a semiconductor structure and a fabrication method thereof.

BACKGROUND

As a semiconductor memory commonly used in an electronic device such as a computer, a dynamic random access memory (DRAM) includes a plurality of memory cells. Each of the memory cells includes: a capacitor and a transistor electrically connected to the capacitor.

At present, the transistor typically adopts a vertical structure. For example, a conductive channel, a source, and a drain of the transistor may be formed on the basis of a silicon pillar arranged in a direction perpendicular to a substrate. That is, the silicon pillar includes a conductive channel, and a source and a drain positioned at two ends of the conductive channel. The capacitor is formed at a top of the silicon pillar, and the capacitor generally includes a first electrode, a second electrode, and a high-K dielectric layer arranged between the first electrode and the second electrode. The first electrode is in contact with the source in the silicon pillar.

However, the source of the transistor may be obtained by performing ion implantation on the silicon pillar or by forming a metal silicide. This easily leads to a larger contact resistance between the capacitor and the source, and also easily has a negative effect on film forming quality of the high-K dielectric layer in the capacitor, thereby having a negative effect on electrical properties and yield of the DRAM.

SUMMARY

According to various embodiments of the present disclosure, a semiconductor structure and a fabrication method thereof are provided.

According to some embodiments, one aspect of the present disclosure provides a method for fabricating a semiconductor structure, including: providing a substrate, where a semiconductor stacked structure formed by alternately stacking first semiconductor layers and second semiconductor layers is formed on the substrate; patterning the semiconductor stacked structure to form a plurality of cell structures extending along a first direction and arranged at intervals; removing a part of the first semiconductor layers positioned in first regions in the plurality of cell structures, such that a part of the second semiconductor layers positioned in the first regions form capacitor support structures; and forming capacitors on exposed surfaces of the capacitor support structures. The capacitors include first electrodes, dielectric layers and second electrodes sequentially stacked along a direction distant from the capacitor support structures, where all the capacitors in the first regions share the same second electrode.

According to some embodiments, another aspect of the present disclosure provides a semiconductor structure. The semiconductor structure includes a substrate, a plurality of capacitor support structures, and a plurality of capacitors. The plurality of capacitor support structures extend in parallel to the substrate along a first direction and are arranged in an array in a plane perpendicular to the substrate. The plurality of capacitors are in one-to-one correspondence to the capacitor support structures, and the plurality of capacitors include first electrodes, dielectric layers and second electrodes sequentially stacked along a direction distant from the capacitor support structures; where the plurality of capacitors share the same second electrode.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 9A, FIG. 9B, FIG. 9C, FIG. 9D to FIG. 24A, FIG. 24B, FIG. 24C, and FIG. 24D are schematic diagrams of structures obtained by each step in a method for fabricating a semiconductor structure according to an embodiment, respectively;

FIG. 25 is a schematic flow diagram of a method for fabricating sources and second isolation material layers according to an embodiment;

FIG. 26 is a schematic diagram of a structure obtained by a fabrication method shown in FIG. 25;

FIG. 27 is a schematic flow diagram of another method for fabricating sources and third isolation material layers according to an embodiment;

FIG. 28 and FIG. 29 are schematic diagrams of a structure obtained by the fabrication method shown in FIG. 27, respectively;

FIG. 30 is a schematic flow diagram of a method for fabricating drains according to an embodiment;

DETAILED DESCRIPTION

Figure 1:
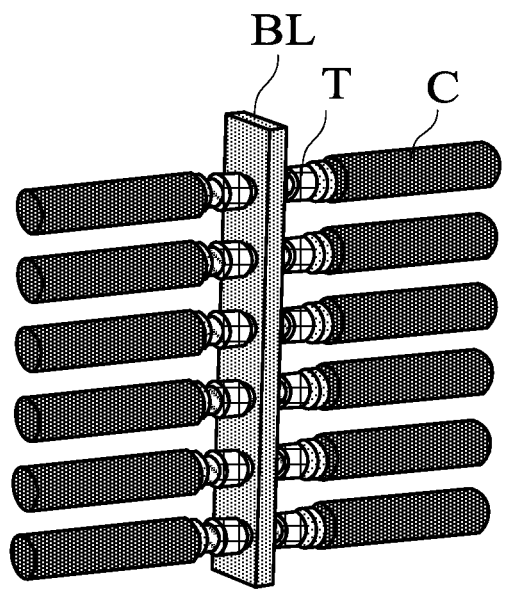
FIG. 1 is a schematic structural diagram of a semiconductor structure according to an embodiment.

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present.

Spatially relationship terms such as "below", "under", "lower", "beneath", "above", "upper" and the like may be used herein to describe relationships between one element or feature as shown in the figures and another element(s) or feature(s). It should be understood that the spatially relationship terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the exemplary terms "under" and "below" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should be also understood that the terms "comprise/include" or "having" and so on refer to the presence of stated features, integers, steps, operations, components, parts or combinations thereof, but do not preclude possibility of the presence or addition of one or more other features, integers, steps, operations, components, parts or combinations thereof. Meanwhile, the term "and/or" used in the specification includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, the embodiments of the present disclosure should not be construed as being limited to particular shapes of regions illustrated herein but may include deviations in shapes that result, for example, from the manufacturing techniques. Thus, regions illustrated in the figures are schematic in nature and their shapes neither illustrate an actual shape of a region of the device nor limit the scope of the present disclosure.

As a semiconductor memory commonly used in an electronic device such as a computer, a dynamic random access memory (DRAM) includes a plurality of memory cells. Each of the memory cells includes: a capacitor and a transistor electrically connected to the capacitor.

In some embodiments, the transistor adopts a vertical structure. For example, a conductive channel, a source, and a drain of the transistor may be formed on the basis of a silicon pillar arranged in a direction perpendicular to a substrate. That is, the silicon pillar includes a conductive channel, and a source and a drain positioned at two ends of the conductive channel. The capacitor is formed at a top of the silicon pillar, and the capacitor generally includes a first electrode, a second electrode, and a high-K dielectric layer arranged between the first electrode and the second electrode. The first electrode is in contact with and connected to the source in the silicon pillar. However, the source of the transistor may be obtained by performing ion implantation on the silicon pillar or by forming a metal silicide. This easily leads to a larger contact resistance between the capacitor and the source, and also easily has a negative effect on film forming quality of the high-K dielectric layer in the capacitor, thereby having a negative effect on electrical properties and yield of the DRAM.

On this basis, referring to FIG. 1, the embodiments of the present disclosure provide a semiconductor structure. Horizontal capacitors C and horizontal transistors T may be employed to form memory cells, and the memory cells are connected to bit lines BL extending along a vertical direction. In this way, it is beneficial to stack the memory cells in a three-dimensional space, and it may avoid a larger contact resistance of storage nodes caused by ion implantation of silicon pillars or formation of metal silicides, and the problem of easily affecting the film forming quality of the high-K dielectric layer in the capacitor. Therefore, use reliability and production yield of the semiconductor structure can be improved.

Figure 2:
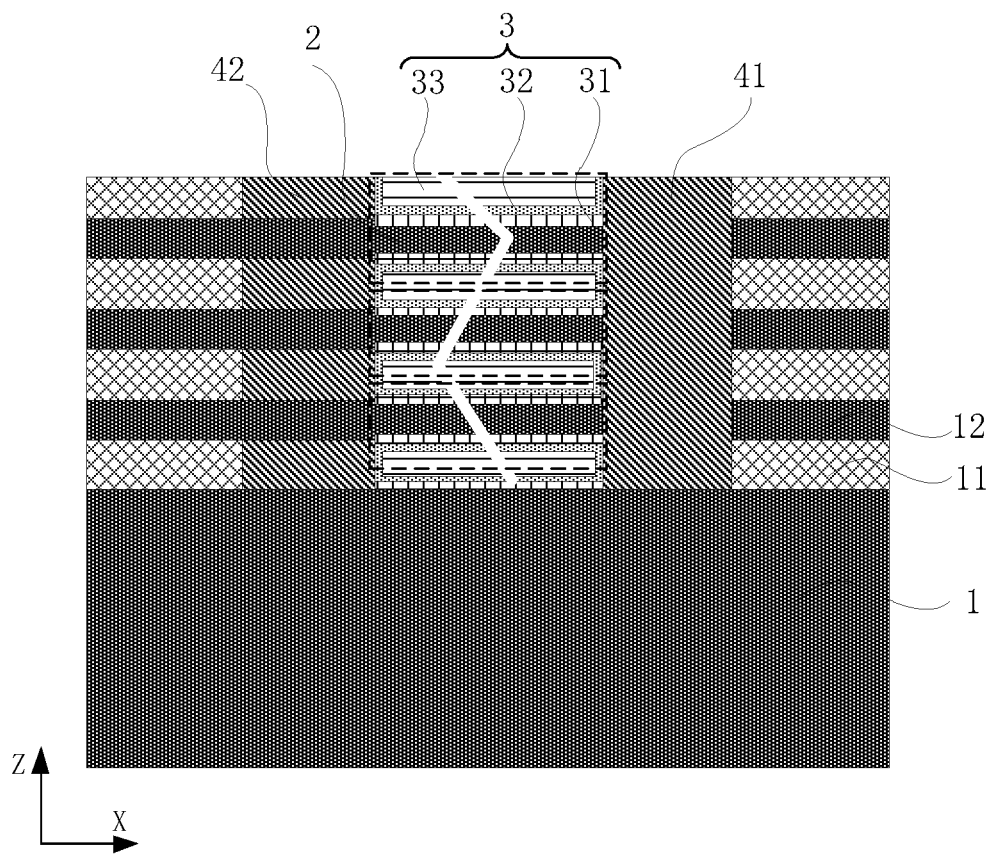
FIG. 2 is a schematic structural diagram of another semiconductor structure according to an embodiment.

Referring to FIG. 2, some embodiments of the present disclosure provide a semiconductor structure. The semiconductor structure includes a substrate 1, a plurality of capacitor support structures 2, and a plurality of capacitors 3. The plurality of capacitor support structures 2 extend in parallel to the substrate 1 along a first direction (e.g., an X direction) and are arranged in an array in a plane perpendicular to the substrate 1. Here, a direction parallel to the substrate 1 is a horizontal direction, and a direction perpendicular to the substrate 1 is a vertical direction (e.g., a Z direction). The plurality of capacitors 3 are in one-to-one correspondence with the capacitor support structures 2, and the capacitors 3 include first electrodes 31, dielectric layers 32 and second electrodes 33 sequentially stacked along a direction distant from the capacitor support structures 2. The plurality of capacitors 3 share the same second electrode 33.

In some embodiments, a semiconductor stacked structure formed by alternately stacking first semiconductor layers 11 and second semiconductor layers 12 is formed on the substrate 1, to form the capacitor support structures 2 based on the second semiconductor layers 12. The earliest formed and the latest formed in the semiconductor stacked structure both are the first semiconductor layers 11. A material of the first semiconductor layers 11 is different from that of the substrate 1, and the material of the first semiconductor layers 11 is different from that of the second semiconductor layers 12. For example, the substrate 1 is a silicon substrate, the first semiconductor layers 11 are silicon germanium (SiGe) layers, and the second semiconductor layers 12 are silicon (Si) layers.

In some embodiments, the capacitor support structures 2 are columnar, such as horizontal columnar structures. Orthographic projections of the capacitor support structures 2 on the plane perpendicular to the substrate 1 are, for example, rectangular, circular or elliptic. In the capacitors 3, the first electrodes 31, the dielectric layers 32, and the second electrodes 33 are stacked in sequence, and are arranged along the direction distant from the capacitor support structures 2, which may be correspondingly manifested as below. The first electrodes 31 surround and wrap columnar surfaces (i.e., side walls) of the capacitor support structures 2, the dielectric layers 32 surround and wrap surfaces of the first electrodes 31, and the second electrodes 33 surround and wrap surfaces of the dielectric layers 32 and fill gaps between adjacent capacitors 3.

On this basis, the plurality of capacitors 3 share the same second electrode 33, which means that the second electrodes 33 of the plurality of capacitors 3 are formed by means of the same material and the same process. That is, the second electrodes 33 of the plurality of capacitors 3 are integrated structures.

In addition, the first electrodes 31 and the second electrodes 33 in the capacitors 3 may be formed of conductive materials having excellent conductivity, such as metals or metal compounds. The dielectric layers 32 in the capacitors 3 are, for example, high-K dielectric layers.

In some embodiments, with continued reference to FIG. 2, free ends of the capacitor support structures 2 and free ends of the capacitors 3 along the horizontal direction are provided with isolation portions 41, to effectively insulate the free ends of the capacitor support structures 2 from the free ends of the capacitors 3. Connection ends of the capacitor support structures 2 along the horizontal direction may extend out to connect other electrical structures such as transistors. Moreover, sides of the connection ends of the adjacent capacitor support structures 2 are insulated by means of first interlayer dielectric layers 42. The isolation portions 41 and the first interlayer dielectric layers 42 described above may be formed of an insulating material, such as silicon oxide, silicon nitride, or silicon oxynitride. This is not limited in the embodiments of the present disclosure.

Figure 3:
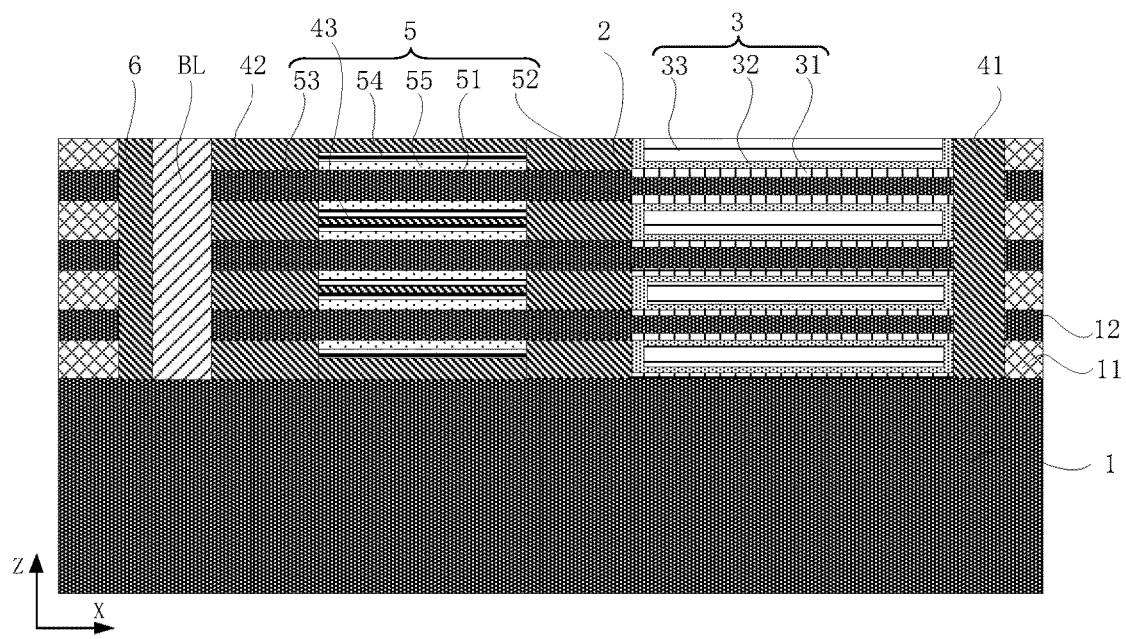
FIG. 3 is a schematic structural diagram of yet another semiconductor structure according to an embodiment.

Referring to FIG. 3, in some embodiments, the semiconductor structure further includes a plurality of transistors 5 in one-to-one correspondence to the capacitors 3. The transistors 5 include channel pillars 51, sources 52, drains 53, and gates 54. The channel pillars 51 extend in parallel to the substrate 1 along the first direction (e.g., the X direction). The source 52 and the drain 53 are positioned at two ends of the channel pillar 51, respectively. The source 52 is connected to the first electrode 31 correspondingly. The drain 53 is positioned on a side of the source 52 facing away from the first electrode 31, and is configured to connect a bit line BL. The gate 54 is disposed on a side wall of the channel pillar 51. In addition, a gate dielectric layer 55 is further provided between the gate 54 and the channel pillar 51.

It is to be understood with reference to some of the foregoing embodiments, the channel pillars 51 and the capacitor support structures 2 may be formed simultaneously based on the second semiconductor layers 12. That is, the channel pillars 51 are correspondingly connected to the capacitor support structures 2, and the channel pillars 51 and the capacitor support structures 2 connected thereto are respectively parts of the same semiconductor layer (i.e., the second semiconductor layers 12) positioned in different regions. In some embodiments, it is to be understood that the channel pillars 51 and the corresponding capacitor support structures 2 form an integrated structure; or it is also to be understood that the channel pillars 51 are obtained by extending the capacitor support structures 2. On this basis, in some embodiments, the sources 52 and the drains 53 may be respectively formed on surfaces of two ends of the channel pillars 51 in the horizontal direction. For example, the sources 52 and the drains 53 are respectively formed by means of a deposition process, a doping process, or a silicon metallization process.

In some embodiments, the channel pillars 51 and the capacitor support structures 2 have different radial sizes.

In some embodiments, the radial sizes of the capacitor support structures 2 are smaller than the radial sizes of the channel pillars 51 in the same direction, to reduce electric leakage of the capacitors 3.

In some embodiments, two ends of the channel pillars 51 for arranging the sources 52 and the drains 53 may be thinned by etching, to ensure formation thicknesses of the sources 52 and the drains 54.

In some embodiments, surfaces of the sources 52 in the vertical direction may also abut against surfaces of first electrodes 31 in the vertical direction, to enhance electrical connection between the sources 52 and the first electrodes 31.

In addition, with continued reference to FIG. 3, the adjacent sources 52 and the adjacent drains 53 may be insulated by means of the first interlayer dielectric layers 42. The adjacent gates 54 may be insulated by means of second interlayer dielectric layers 43.

In some embodiments, with continued reference to FIG. 3, the semiconductor structure further includes a plurality of bit lines BL arranged at intervals in parallel. The bit lines BL are positioned on sides of the transistors 5 away from the capacitor support structures 2 and extend along the direction perpendicular to the substrate 1 (i.e., the vertical direction). The bit lines BL are correspondingly connected to the drains 53 of the transistors 5. For example, the bit lines BL may be correspondingly connected to the drains 53 of the plurality of transistors 5 positioned in the same vertical direction. Moreover, side walls 6 are provided on the side walls of bit lines BL that are not connected to the transistors 5, to isolate the bit lines BL from other structures (such as the first semiconductor layers 11 and the second semiconductor layers 12).

Figure 4:
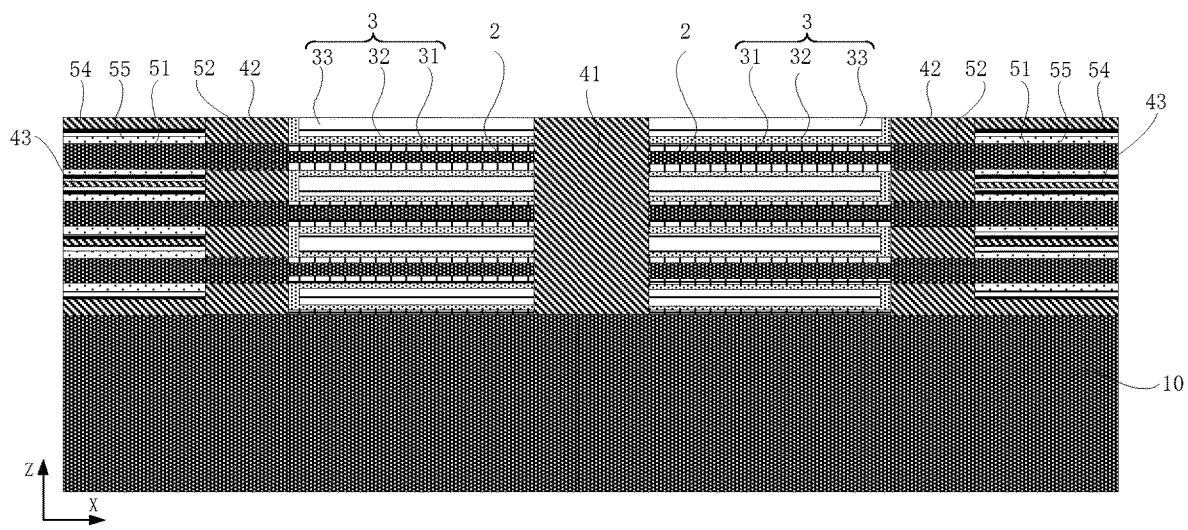
FIG. 4 is a schematic structural diagram of still another semiconductor structure according to an embodiment.

Referring to FIG. 4, in some embodiments, central axes of at least two capacitor support structures 2 are positioned on a same straight line, and the adjacent two capacitor support structures 2 positioned on the straight line are insulated from each other. As thus, the two capacitor support structures 2 positioned on the same straight line and arranged adjacently may be integrally fabricated first based on one of the second semiconductor layers 12 and then may be separated and segmented, to form two separate capacitor support structures 2. Similarly, the capacitors 3 corresponding to the two capacitor support structures 2 described above may be integrally fabricated first at corresponding positions of the second semiconductor layers 12, and then may be separated and segmented to form two separate capacitors 3. Herein, the separation of the capacitors 3 and the separation of the capacitor support structures 2 may be formed by means of one-time process. Furthermore, after the separate capacitor support structures 2 and the separate capacitors 3 are formed by means of separation, the isolation portions 41 may be formed at the separations, to effectively insulate the adjacent capacitor support structures 2 and the adjacent capacitors 3.

Figure 5:
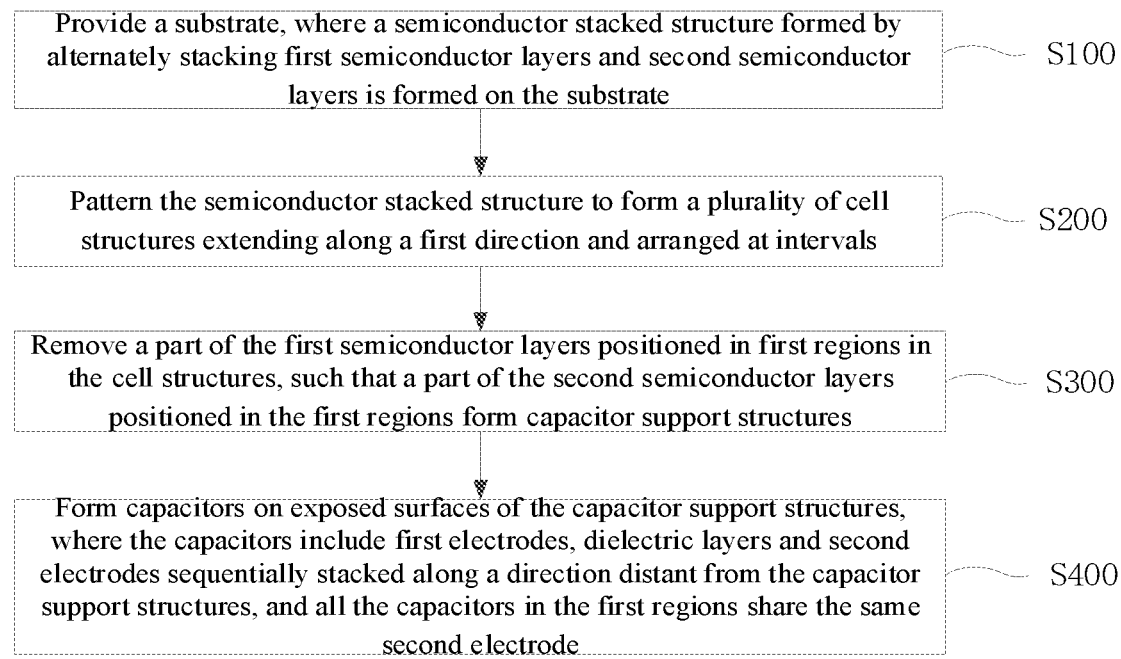
FIG. 5 is a schematic flow diagram of a method for fabricating a semiconductor structure according to an embodiment.

The semiconductor structure provided by the embodiments of the present disclosure is as described above. Referring to FIG. 5, some embodiments of the present disclosure further provide a method for fabricating a semiconductor structure, which is configured for fabricating some of the aforementioned semiconductor structures. The fabrication method includes following steps: S100, providing a substrate, where a semiconductor stacked structure formed by alternately stacking first semiconductor layers and second semiconductor layers is formed on the substrate; S200, patterning the semiconductor stacked structure to form a plurality of cell structures extending along a first direction and arranged at intervals; S300, removing a part of the first semiconductor layers positioned in first regions in the cell structures, such that a part of the second semiconductor layers positioned in the first regions form capacitor support structures; and S400, forming capacitors on exposed surfaces of the capacitor support structures. The capacitors include first electrodes, dielectric layers and second electrodes sequentially stacked along a direction distant from the capacitor support structures, where all the capacitors in the first regions share the same second electrode.

Figure 6:
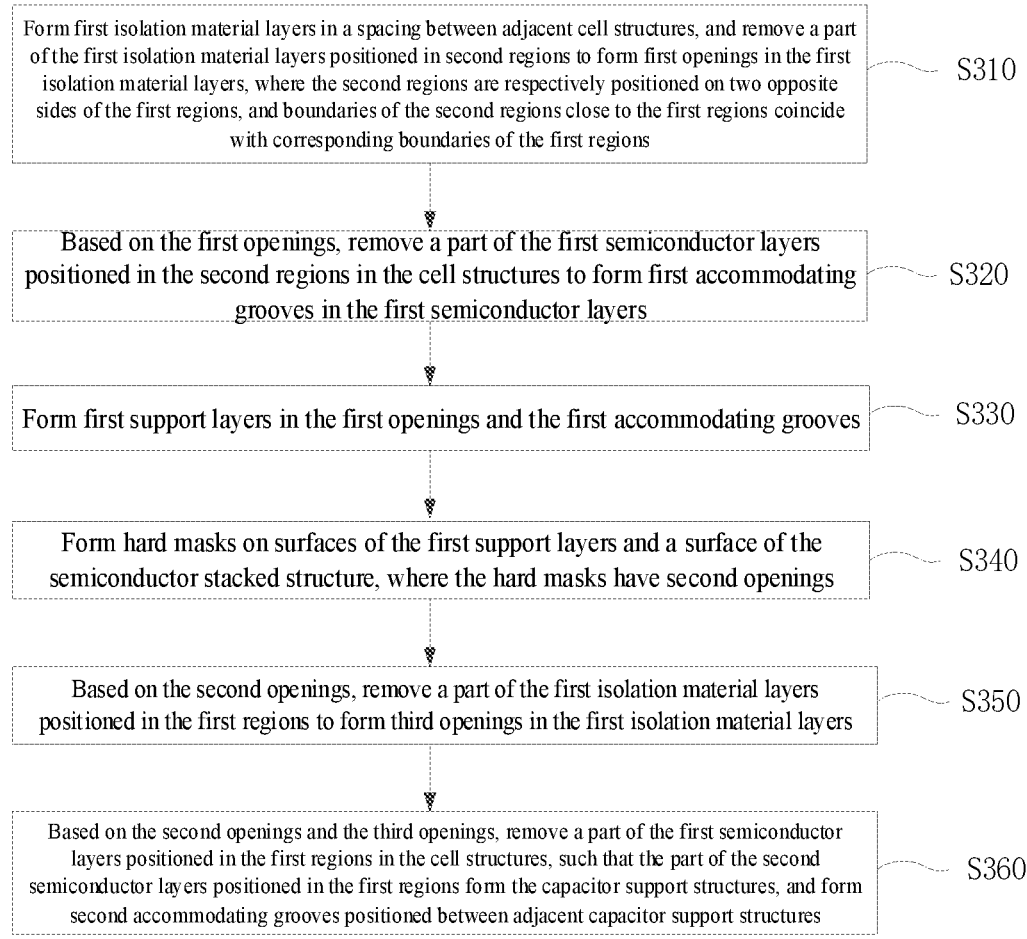
FIG. 6 is a schematic flow diagram of a method for fabricating a capacitor support structure according to an embodiment.

In some embodiments, referring to FIG. 6, the Step S300 of removing a part of the first semiconductor layers positioned in first regions in the cell structures, such that a part of the second semiconductor layers positioned in the first regions form capacitor support structures includes following steps: S310, forming first isolation material layers in a spacing between adjacent cell structures, and removing a part of the first isolation material layers positioned in second regions to form first openings in the first isolation material layers, where the second regions are respectively positioned on two opposite sides of the first regions, and boundaries of the second regions close to the first regions coincide with corresponding boundaries of the first regions; S320, based on the first openings, removing a part of the first semiconductor layers positioned in the second regions in the plurality of cell structures to form first accommodating grooves in the first semiconductor layers; and S330, forming first support layers in the first openings and the first accommodating grooves.

In some embodiments, with continued reference to FIG. 6, Step S300 further includes following steps: S340, forming hard masks on surfaces of the first support layers and a surface of the semiconductor stacked structure, where the hard masks have second openings; S350, based on the second openings, removing a part of the first isolation material layers positioned in the first regions to form third openings in the first isolation material layers; and S360, based on the second openings and the third openings, removing a part of the first semiconductor layers positioned in the first regions in the cell structures, such that the part of the second semiconductor layers positioned in the first regions form the capacitor support structures, and form second accommodating grooves positioned between adjacent capacitor support structures.

In some possible embodiments, the Step S360 of based on the second openings and the third openings, removing a part of the first semiconductor layers positioned in the first regions in the cell structures, such that the part of the second semiconductor layers positioned in the first regions form the capacitor support structures, and form second accommodating grooves positioned between adjacent capacitor support structures further includes: after removing the part of the first semiconductor layers positioned in the first regions in the cell structures, etching the part of the second semiconductor layers positioned in the first regions to form columnar structures whose axes are parallel to the first direction, where the columnar structures are the capacitor support structures, and a space between adjacent columnar structures serves as the second accommodating grooves.

In some embodiments, radial sizes of the columnar structures in the first regions are smaller than sizes of the part of the second semiconductor layers positioned in the second regions in the same direction.

In some possible embodiments, the aforementioned method for fabricating a semiconductor structure further includes: etching the part of the second semiconductor layers positioned in the first regions, to form two capacitor support structures arranged at intervals in the same second semiconductor layer.

Figure 7:
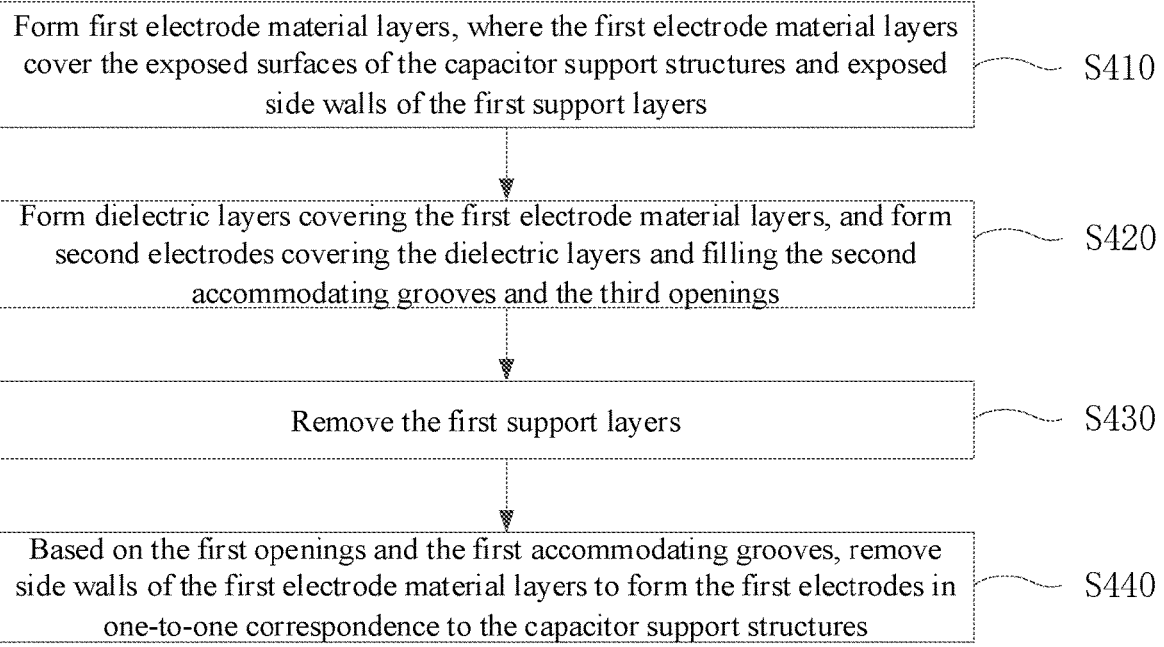
FIG. 7 is a schematic flow diagram of a method for fabricating a capacitor according to an embodiment.

In some embodiments, referring to FIG. 7, Step S400 of forming capacitors on exposed surfaces of the capacitor support structures includes following steps: S410, forming first electrode material layers, where the first electrode material layers cover the exposed surfaces of the capacitor support structures and exposed side walls of the first support layers; S420, forming dielectric layers covering the first electrode material layers, and forming second electrodes covering the dielectric layers and filling the second accommodating grooves and the third openings; S430, removing the first support layers; and S440, based on the first openings and the first accommodating grooves, removing side walls of the first electrode material layers to form the first electrodes in one-to-one correspondence to the capacitor support structures.

Figure 8:
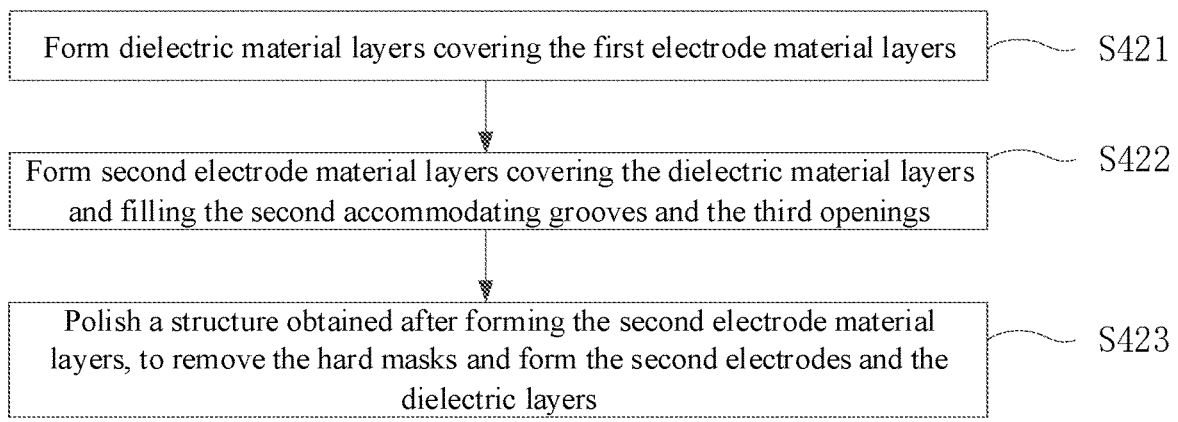
FIG. 8 is a schematic flow diagram of a method for fabricating a dielectric layer and a second electrode according to an embodiment.
Figure 9A:
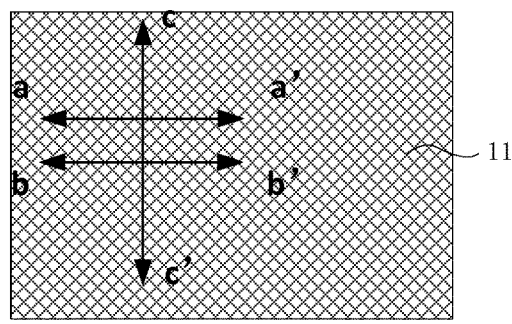
Figure 9B:
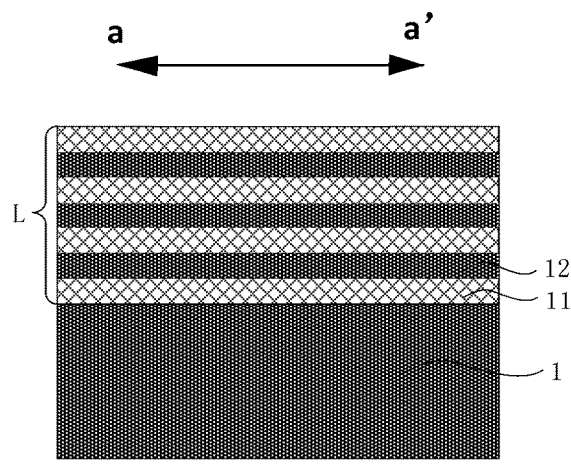
Figure 9C:
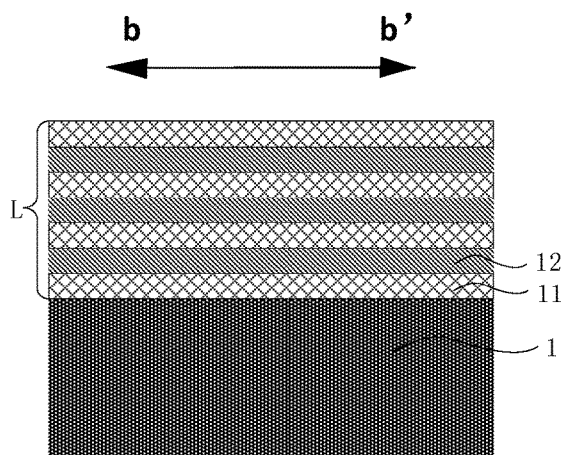
Figure 9D:
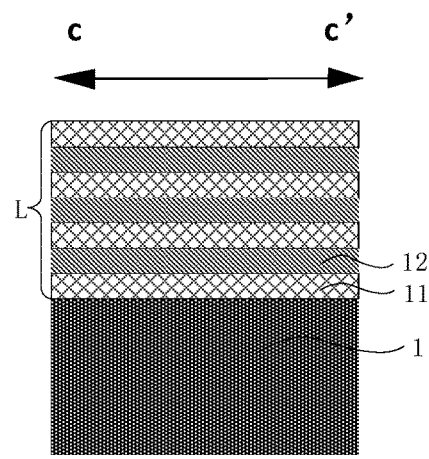
Figure 10A:
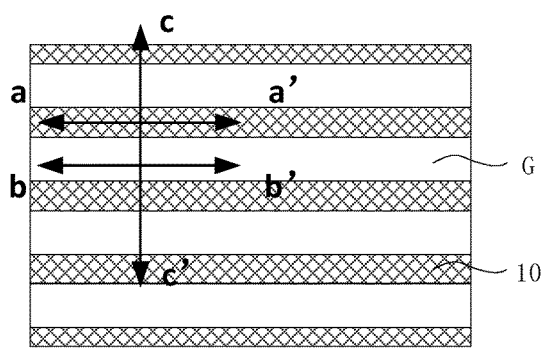
Figure 10B:
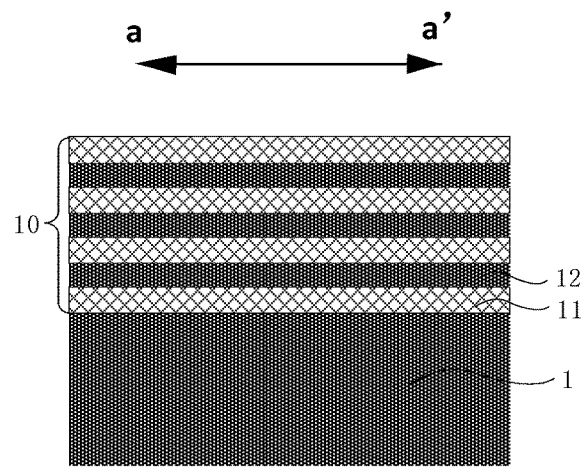
Figure 10C:
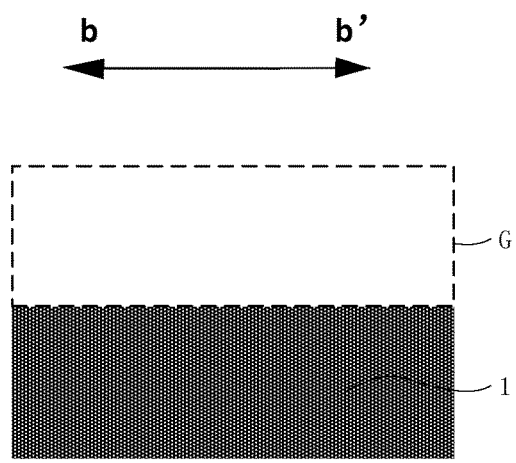
Figure 10D:
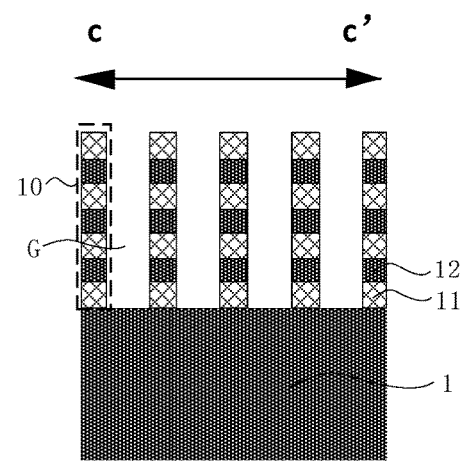
Figure 11A:
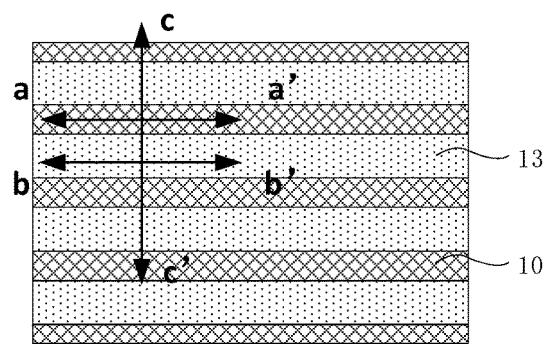
Figure 11B:
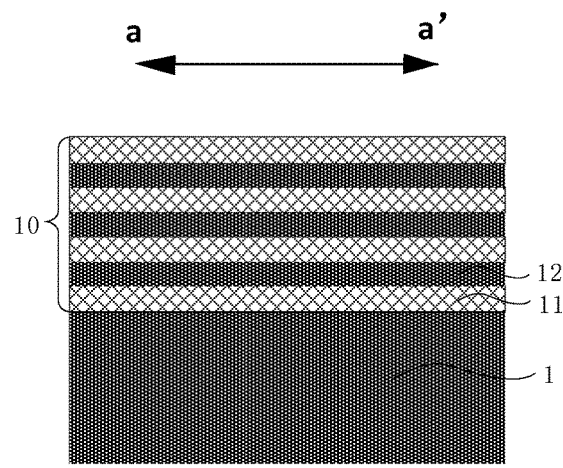
Figure 11C:
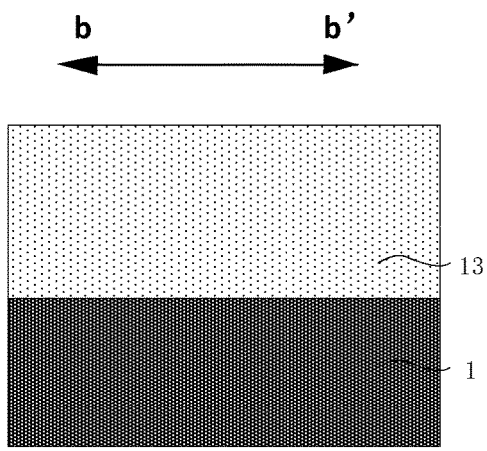
Figure 11D:
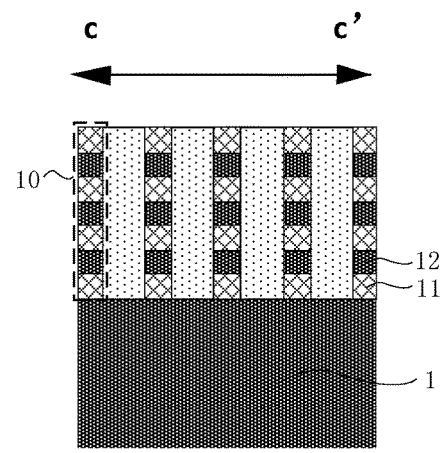
Figure 12A:
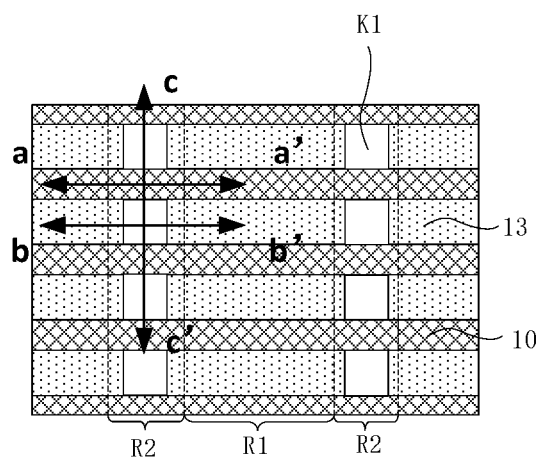
Figure 12B:
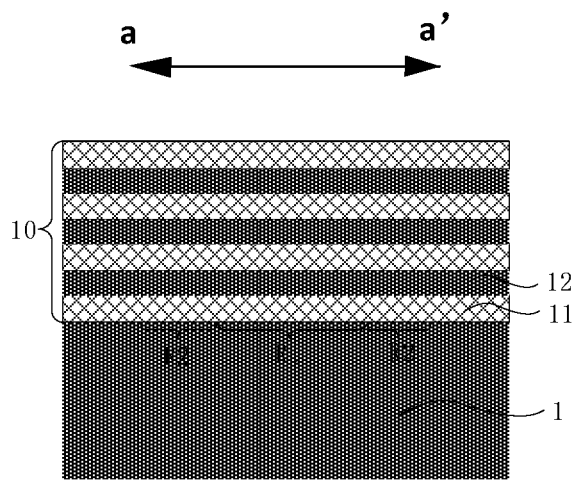
Figure 12C:
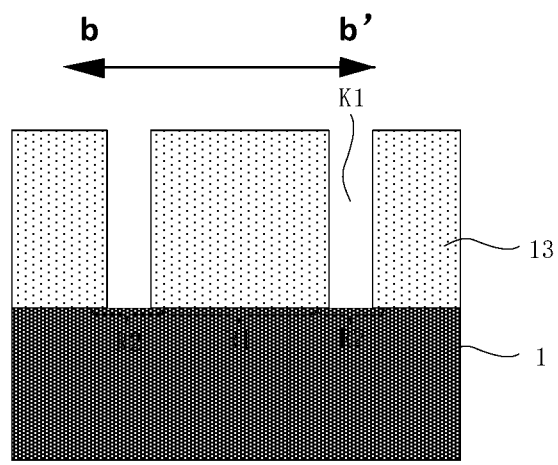
Figure 12D:
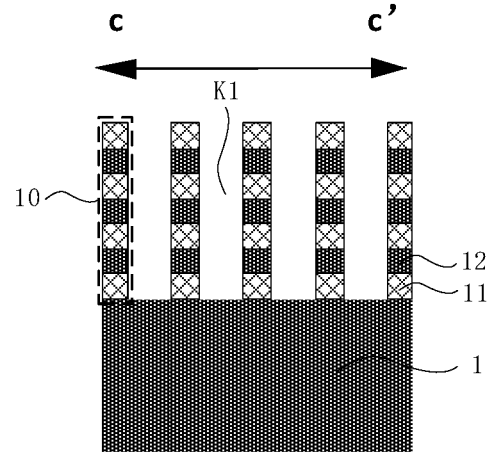
Figure 13A:
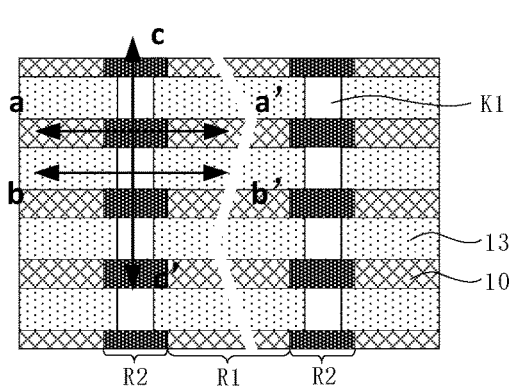
Figure 13B:
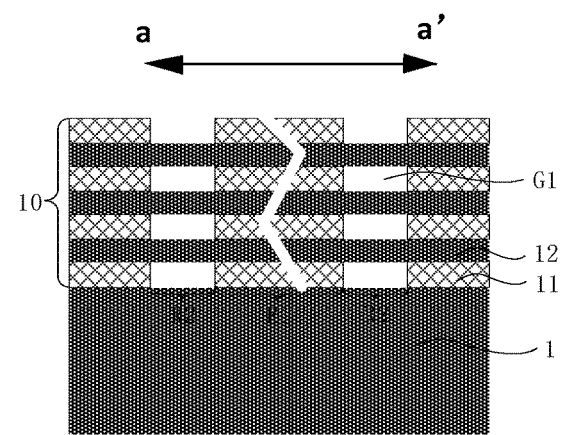
Figure 13C:
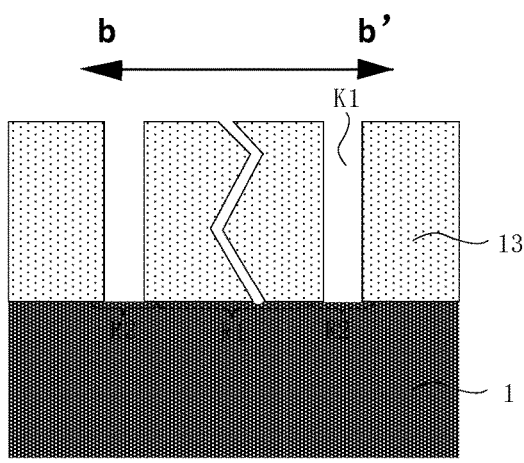
Figure 13D:
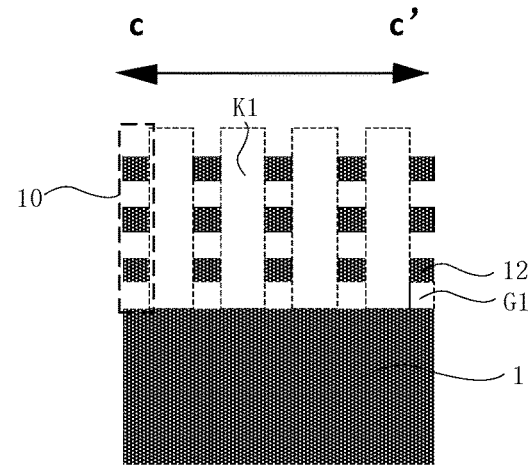
Figure 14A:
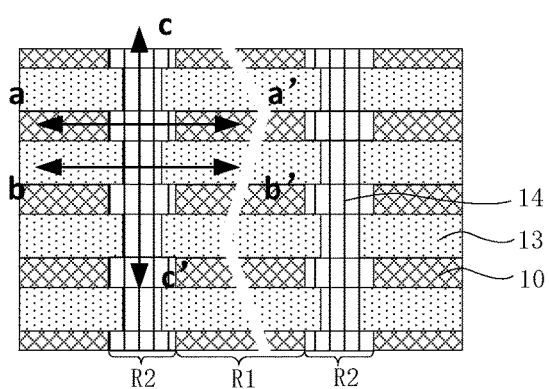
Figure 14B:
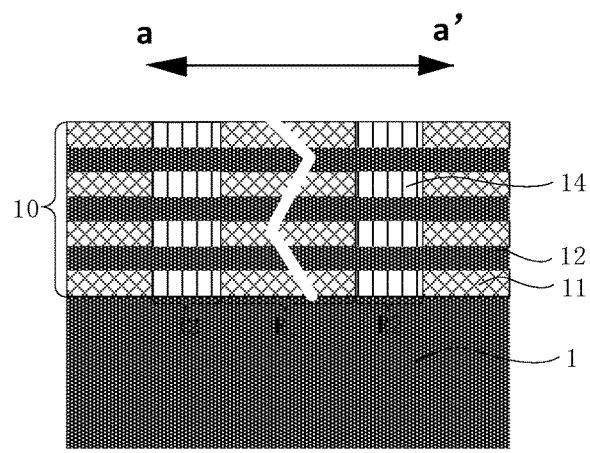
Figure 14C:
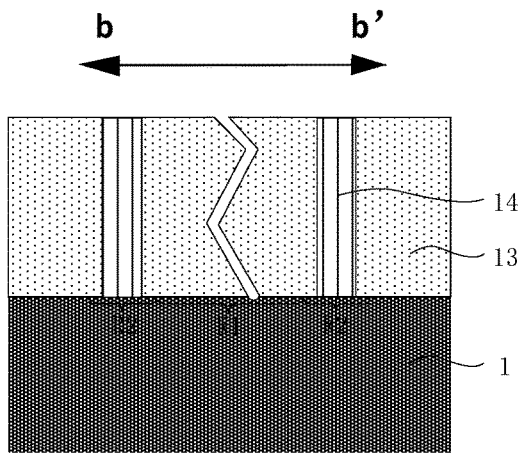
Figure 14D:
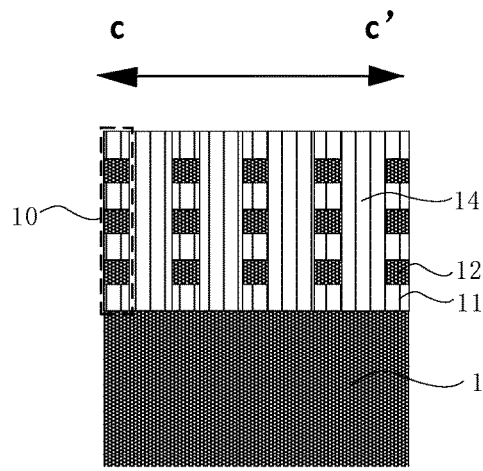
Figure 15A:
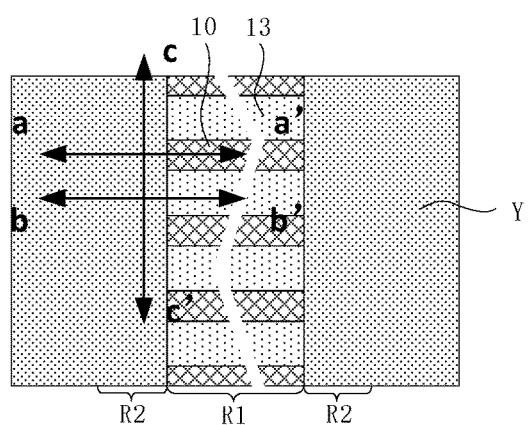
Figure 15B:
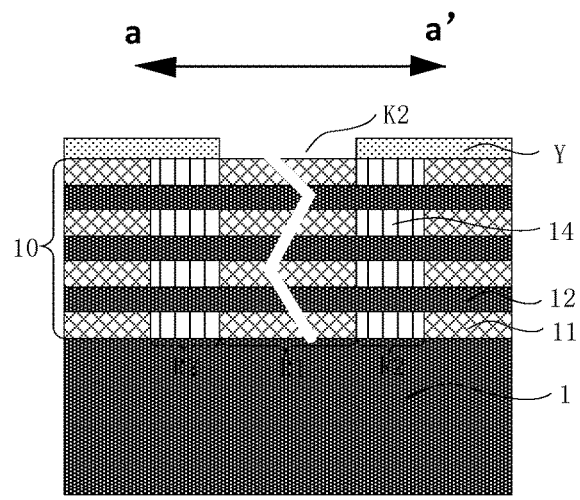
Figure 15C:
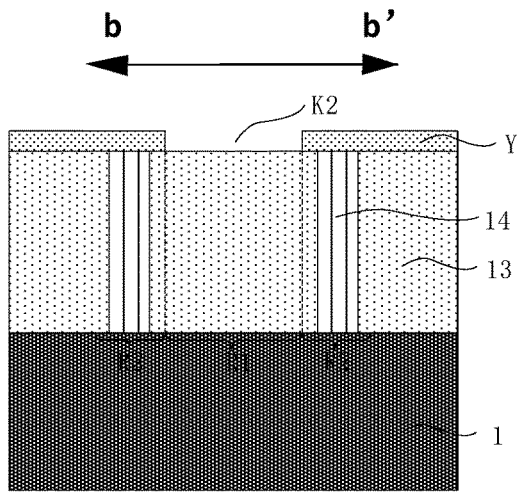
Figure 15D:
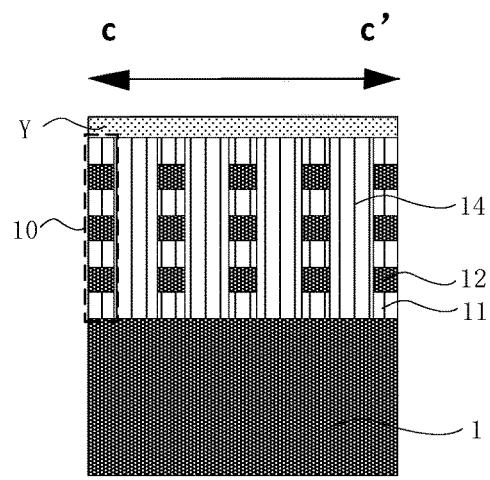
Figure 16A:
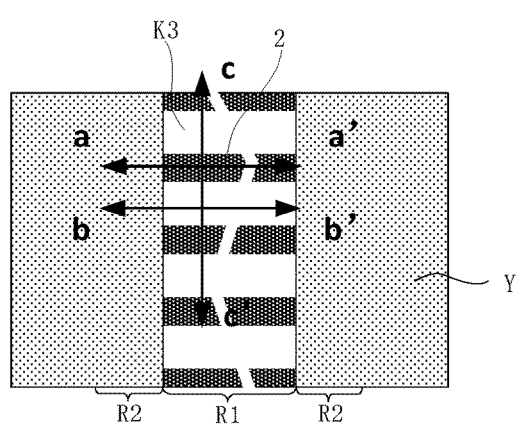
Figure 16B:
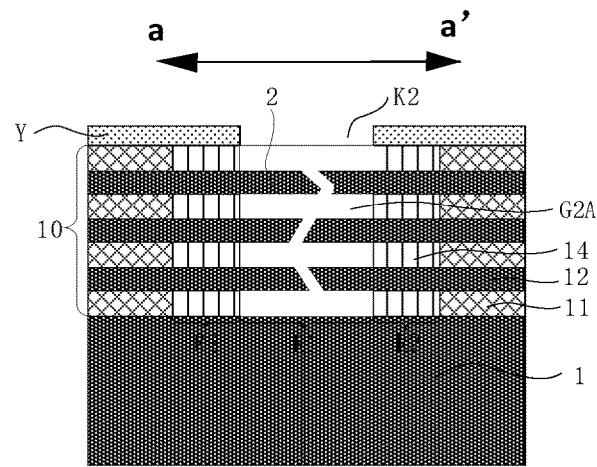
Figure 16C:
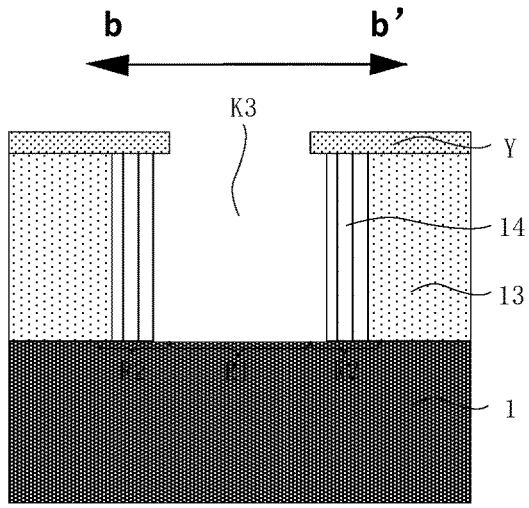
Figure 16D:
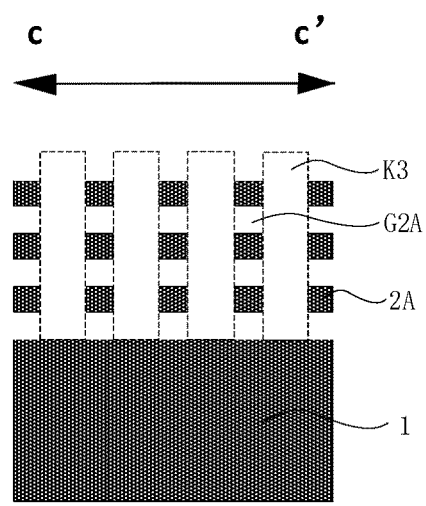

In some embodiments, the first electrode material layers formed in Step S410 also cover the exposed surfaces of the hard masks. Referring to FIG. 8, Step S420 of forming dielectric layers covering the first electrode material layers, and forming second electrodes covering the dielectric layers and filling the second accommodating grooves and the third openings include following steps.

S421, forming dielectric material layers covering the first electrode material layers.

S422, forming second electrode material layers covering the dielectric material layers and filling the second accommodating grooves and the third openings.

In some embodiments, the second electrode material layers simultaneously fill the plurality of third openings and the plurality of second accommodating grooves positioned in the same first region.

S423, polishing a structure obtained after forming the second electrode material layers, to remove the hard masks and form the second electrodes and the dielectric layers.

In some embodiments, the first electrode material layers formed in Step S410 also cover the exposed surfaces of the hard masks, and the first electrode material layers also cover the surface of the substrate exposed in the first regions. The Step S440 of based on the first openings and the first accommodating grooves, removing side walls of the first electrode material layers to form the first electrodes in one-to-one correspondence to the capacitor support structures further includes: simultaneously forming first electrodes positioned on the substrate.

In the embodiments of the present disclosure, based on a semiconductor stacked structure formed by alternately stacking first semiconductor layers and second semiconductor layers, a plurality of capacitor support structures extending along a direction parallel to the substrate and arranged at intervals in a direction perpendicular to the substrate, and a plurality of horizontal structure capacitors stacked in the direction perpendicular to the substrate may be fabricated. The capacitors are arranged around peripheral sides of the corresponding capacitor support structures and share a same second electrode. Therefore, the capacitors in the embodiments of the present disclosure adopt horizontal structures and are stacked along the direction perpendicular to the substrate, such that the capacitors and the transistors may be formed in different regions of the substrate respectively, and the transistors may also be fabricated after the capacitors are formed, thereby preventing electrodes and dielectric layers of the capacitors from being adversely affected by ion implantation or silicon metallization during the fabrication of the transistors, to improve electrical properties of the semiconductor structure.

In addition, the fabrication method in the embodiments of the present disclosure is simple and easy for implementation, and the capacitors may be used as support for capacitor stacking, to effectively reduce process challenges caused by miniaturization of device sizes, thereby ensuring the electrical properties of the semiconductor structure while implementing three-dimensional stacking of memory cells, to improve use reliability and production yield of the semiconductor structure.

To more clearly illustrate the fabrication method in some of the above embodiments, some embodiments of the present disclosure are understood with reference to FIGS. 9A to 9D to FIGS. 24A to 24D below. FIG. XB is a cross-sectional view of the structure shown in FIG. XA along the a-a' direction, FIG. XC is a cross-sectional view of the structure shown in FIG. XA along the bb' direction, and FIG. XD is a cross-sectional view of the structure shown in FIG. XA along the c-c direction.

In Step S100, referring to FIGS. 9A to 9D, a substrate 1 is provided, where a semiconductor stacked structure L formed by alternately stacking first semiconductor layers 11 and second semiconductor layers 12 is formed on the substrate 1.

For example, the earliest formed and the latest formed in the semiconductor stacked structure L both are the first semiconductor layers 11. A material of the first semiconductor layers 11 is different from that of the substrate 1, and the material of the first semiconductor layers 11 is different from that of the second semiconductor layers 12. For example, the substrate 1 is a silicon substrate, the first semiconductor layers 11 are silicon germanium (SiGe) layers, and the second semiconductor layers 12 are silicon (Si) layers. However, the present disclosure is not limited thereto.

In Step S200, referring to FIGS. 10A to 10D, the semiconductor stacked structure L is patterned to form a plurality of cell structures 10 extending along a first direction (e.g., the a-a' direction) and distributed at intervals.

Here, a width of a gap G between adjacent cell structures 10 may be selected and determined according to capacitance distribution density.

In Step S300, referring to FIGS. 11A to 11D to FIGS. 17A to 17D, a part of the first semiconductor layers 11 positioned in first regions R1 in the cell structures 10 are removed, such that a part of the second semiconductor layers 12 positioned in the first regions R1 form capacitor support structures 2. For example, Step S300 may be manifested as Steps S310 to S360 as follows.

In Step S310, referring to FIGS. 11A to 11D, first isolation material layers 13 are formed in the gap G between adjacent cell structures 10. Referring to FIGS. 12A to 12D, a part of the first isolation material layers 13 positioned in second regions R2 are removed to form first openings K1 in the first isolation material layers 13; where the second regions R2 are respectively positioned on two opposite sides of the first regions R1, and boundaries of the second regions R2 close to the first regions R1 coincide with corresponding boundaries of the first regions R1.

In some embodiments, the first isolation material layers 13 are oxide layers, such as silicon oxide layers.

In some embodiments, the first isolation material layers 13 may be removed by means of dry etching, to control shapes and sizes of the first openings K1 well.

In Step S320, referring to FIGS. 13A to 13D, based on the first openings K1, a part of the first semiconductor layers 11 positioned in the second regions R2 in the cell structures 10 are removed to form first accommodating grooves G1 in the first semiconductor layers 11.

In some embodiments, the first semiconductor layers 11 may be removed by means of wet etching.

In some embodiments, sizes of the first accommodating grooves G1 in the first direction (for example, the a-a' direction) is greater than sizes of the first openings K1 in the same direction.

In some embodiments, the sizes of the first accommodating grooves G1 in the first direction (for example, the a-a' direction) may be the equal to the sizes of the corresponding second regions R2 in the same direction.

In Step S330, referring to FIGS. 14A to 14D, first support layers 14 are formed in the first openings K1 and the first accommodating grooves G1.

In some embodiments, the first support layers 14 are nitride layers, such as silicon nitride layers.

In some embodiments, the first support layers 14 may be formed by means of a deposition process, for example, an atomic layer deposition (ALD) process.

In Step S340, referring to FIGS. 15A to 15D, hard masks Y are formed on surfaces of the first support layers 14 and a surface of the semiconductor stacked structure L, and the hard masks Y have second openings K2.

Here, the second openings K2 have the same shape and boundary as the first regions R1, and may be configured to define capacitor formation regions. Materials of the hard masks Y may be selected and set according to requirements, which are not limited in the embodiments of the present disclosure.

In Step S350, referring to FIGS. 16A to 16D, based on the second openings K2, a part of the first isolation material layers 13 positioned in the first regions R1 are removed to form third openings K3 in the first isolation material layers 13.

In Step S360, referring to FIGS. 16A to 16D and FIGS. 17A to 17D, based on the second openings K2 and the third openings K3, a part of the first semiconductor layers 11 positioned in the first regions R1 in the cell structures 10 are removed, such that the part of the second semiconductor layers 12 positioned in the first regions R1 form the capacitor support structures 2, and form second accommodating grooves G2 positioned between adjacent capacitor support structures 2.

Herein, the capacitor support structures 2 and second accommodating grooves G2 may be formed by directly removing the part of the first semiconductor layers 11 positioned in the first regions R1 in the cell structures 10, or may be formed by removing the part of the first semiconductor layers 11 positioned in the first regions R1 in the cell structures 10 and then continuously etching the part of the second semiconductor layers 12 positioned in the first regions R1.

For example, referring to FIGS. 16A to 16D, based on the second opening K2 and the third opening K3, the part of the first semiconductor layers 11 positioned in the first regions R1 in the cell structures 10 are removed, such that the part of the second semiconductor layers 12 positioned in the first regions R1 form initial capacitor support structures 2A, and form initial second accommodating grooves G2A positioned between adjacent initial capacitor support structures 2A. With continued reference to FIG. 17A to FIG. 17D, the part of the second semiconductor layers 12 positioned in the first regions R1 are etched, such that a part of the second semiconductor layers 12 retained in the first regions R1 are formed into columnar structures whose axes are parallel to the first direction (i.e., the X direction parallel to the substrate 1 in some of the foregoing embodiments), and the second accommodating grooves G2 are simultaneously formed. The columnar structures are the capacitor support structures 2.

Figure 17A:
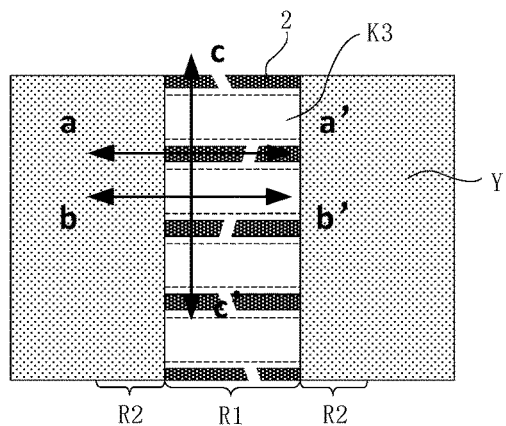
Figure 17B:
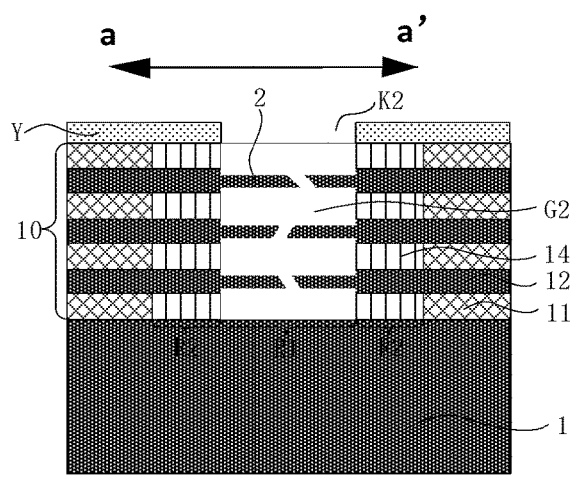
Figure 17C:
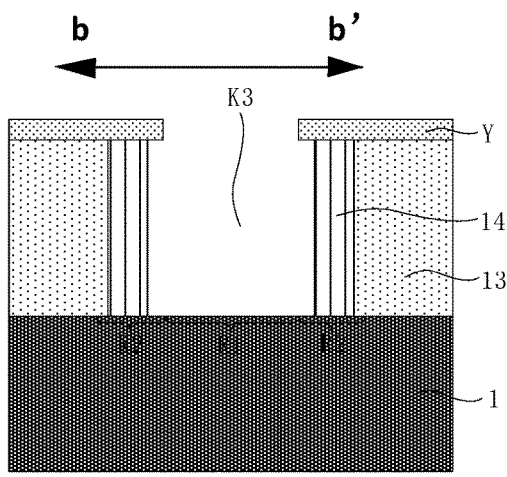
Figure 17D:
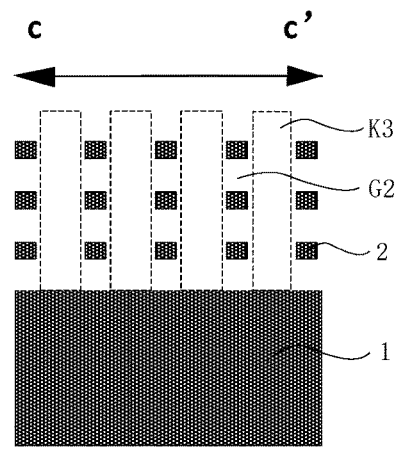

Herein, cross sections of the columnar structures formed by etching the second semiconductor layers 12 in a direction shown in FIG. 17D (i.e., a radial direction) may be rectangular, but not limited to this, for example, the cross sections may also be circular or elliptic, etc. In addition, the columnar structures formed by etching the second semiconductor layers 12 have smaller sizes than an initial part of the second semiconductor layers 12, to reduce the electric leakage of the capacitors 3.

In some embodiments, radial sizes of the columnar structures in the first regions R1 are smaller than sizes of the part of the second semiconductor layers 12 positioned in the second regions R2 in the same direction.

In some embodiments, the second semiconductor layers 12 are etched to form the columnar structures, which may be formed by thermally oxidizing the surfaces of the second semiconductor layers 12 first, and then removing oxidized parts.

In addition, in some possible embodiments, the aforementioned method for fabricating a semiconductor structure further includes: etching the part of the second semiconductor layers 12 positioned in the first regions R1, to form two capacitor support structures 2 arranged at intervals in the same second semiconductor layer 12.

It is to be understood that, in the embodiments of the present disclosure, the capacitor support structures 2 are formed to correspondingly form the capacitors 3 thereon. The preceding step of etching the part of the second semiconductor layers 12 positioned in the first regions R1, to form two capacitor support structures 2 arranged at intervals in the same second semiconductor layer 12 may be completed by selecting an appropriate step before the capacitors 3 are formed, and may be completed by selecting an appropriate step after the capacitors 3 are formed, to fabricate the plurality of capacitors 3.

In Step S400, referring to FIGS. 18A to 18D to FIGS. 23A to 23D, the capacitors 3 are formed on the exposed surfaces of the capacitor support structures 2. The capacitors 3 include first electrodes 31, dielectric layers 32 and second electrodes 33 sequentially stacked along a direction distant from the capacitor support structures 2, where the capacitors 3 in the first regions R1 share the same second electrode 33.

For example, Step S400 may be manifested as Steps S410 to S440 as follows.

In Step S410, referring to FIGS. 18A to 18D, first electrode material layers 310 are formed. The first electrode material layers 310 cover the exposed surfaces of the capacitor support structure s2 and the exposed side walls of the first support layers 14.

In some embodiments, the first electrode material layers 310 may be formed by means of a deposition process, for example, an atomic layer deposition (ALD) process.

In Step S420, referring to FIGS. 19A to 19D to FIGS. 24A to 24D, dielectric layers 32 covering the first electrode material layers 310 are formed. Second electrodes 33 covering the dielectric layers 32 and filling the second accommodating grooves G2 and the third openings K3 are formed.

In some embodiments, the first electrode material layers 310 formed in Step S410 also cover the exposed surfaces of the hard masks Y. Step S420 may be manifested as following Steps S421 to S423.

In Step S421, referring to FIGS. 19A to 19D, dielectric material layers 320 covering the first electrode material layers 310 are formed.

In some embodiments, the dielectric material layers 320 are high-K dielectric material layers.

In some embodiments, the dielectric material layers 320 may be formed by means of a deposition process, for example, an atomic layer deposition (ALD) process. Moreover, formation thicknesses of the dielectric material layers 320 may be selected and set according to requirements. The dielectric material layers 320 match and cover the entire exposed surfaces of the first electrode material layers 310.

In Step S422, referring to FIGS. 20A to 20D, second electrode material layers 330 covering the dielectric material layers 320 and filling the second accommodating grooves G2 and the third openings K3 are formed.

In some embodiments, the second electrode material layers 330 may be formed by means of a deposition process, for example, an atomic layer deposition (ALD) process.

In some embodiments, the second electrode material layers 330 simultaneously fill the plurality of third openings K3 and the plurality of second accommodating grooves G2 in the same first region R1 while covering the exposed surfaces of the dielectric material layers 320. In this way, the plurality of capacitors 3 in the same first region R1 may share the second electrodes 33 formed by the second electrode material layers 330.

In some embodiments, the second electrode material layers 330 and the first electrode material layers 310 may be formed of the same material.

In Step S423, referring to FIGS. 21A to 21D, a structure obtained after forming the second electrode material layers 330 is polished, to remove the hard masks Y and form the second electrodes 33 and the dielectric layers 32.

In some embodiments, the structure obtained after forming the second electrode material layers 330 is polished may means of chemical mechanical polishing (CMP).

In Step S430, referring to FIGS. 22A to 22D, the first support layers 14 are removed.

In some embodiments, the first support layers 14 are removed by means of wet etching.

Here, after the first support layers 14 are removed, the first openings K1 and the first accommodating grooves G1 may be reopened.

In Step S440, referring to FIGS. 23A to 23D, side walls of the first electrode material layers 310 are removed based on the first openings K1 and the first accommodating grooves G1, to form the first electrodes 31 in one-to-one correspondence to the capacitor support structures 2.

Herein, the side walls of the first electrode material layers 310 refer to a part of the first electrode material layers 310 exposed in the first openings K1 and the first accommodating grooves G1 and perpendicular to the substrate 1.

Figure 18A:
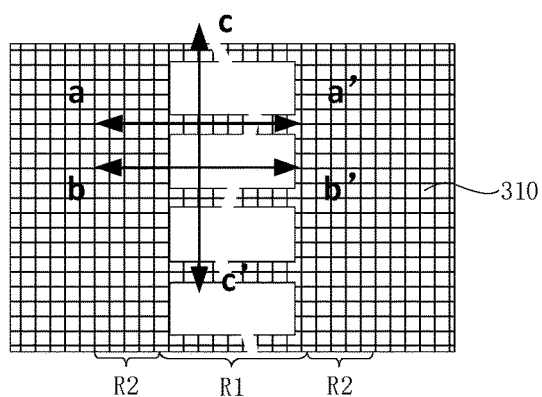
Figure 18B:
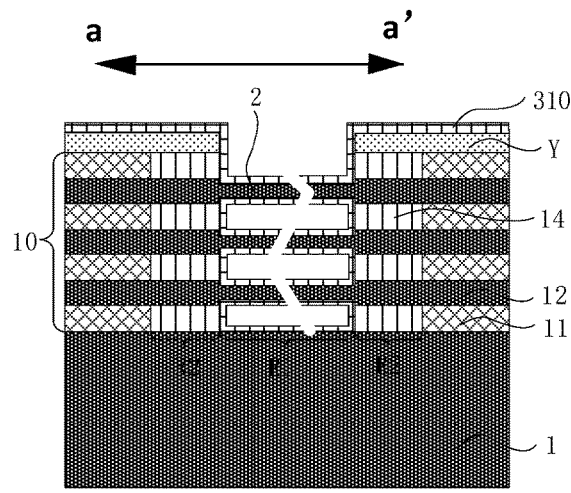
Figure 18C:
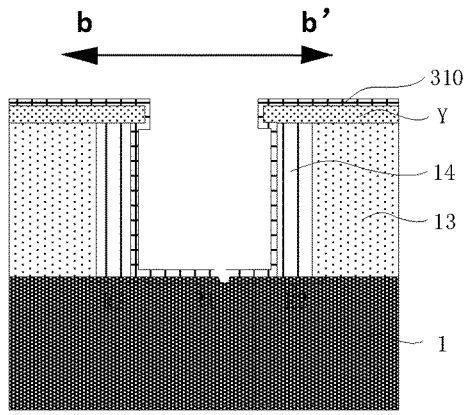
Figure 18D:
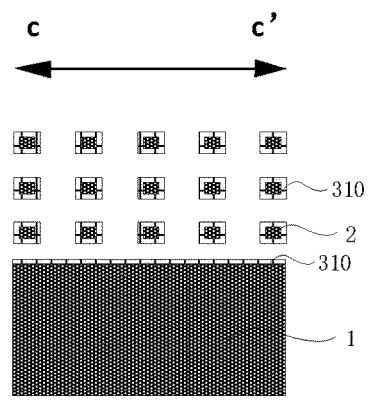
Figure 19A:
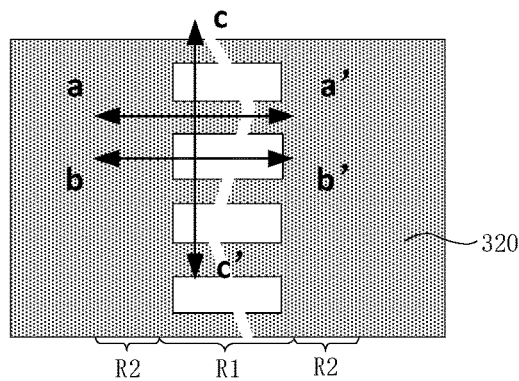
Figure 19B:
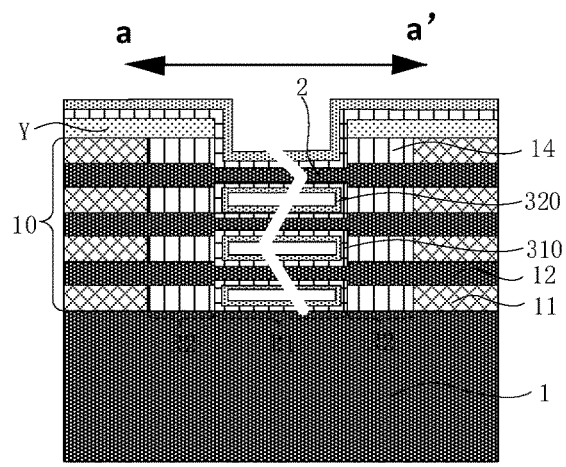
Figure 19C:
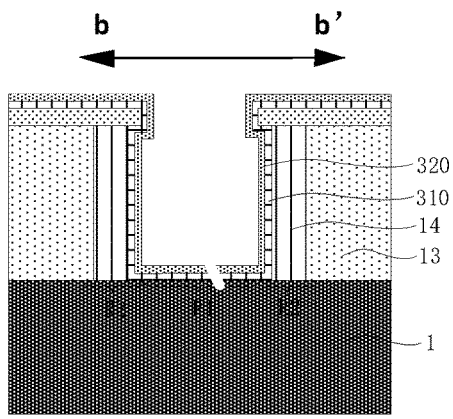
Figure 19D:
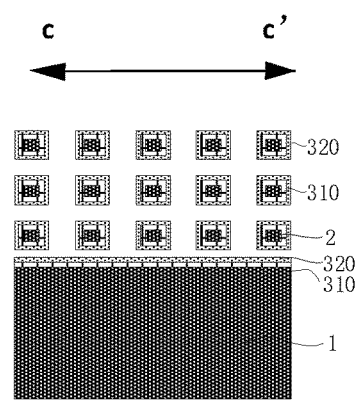
Figure 20A:
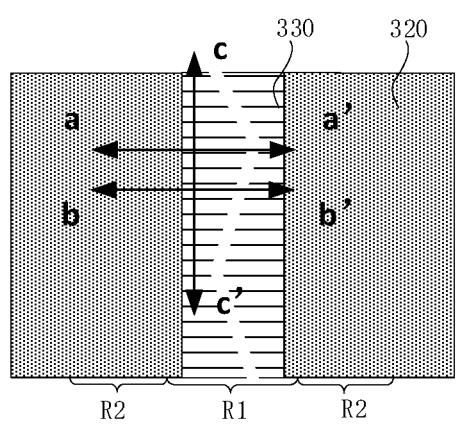
Figure 20B:
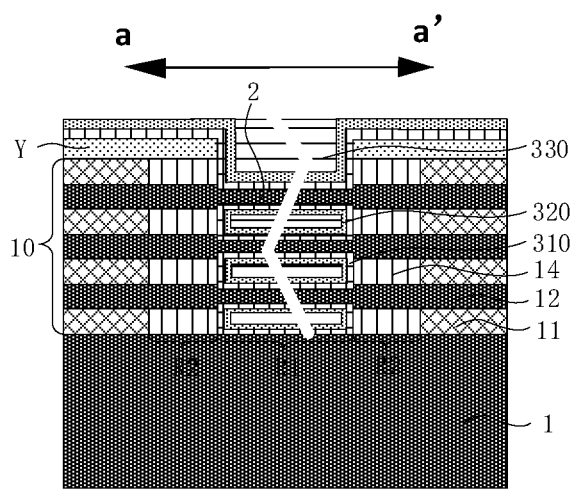
Figure 20C:
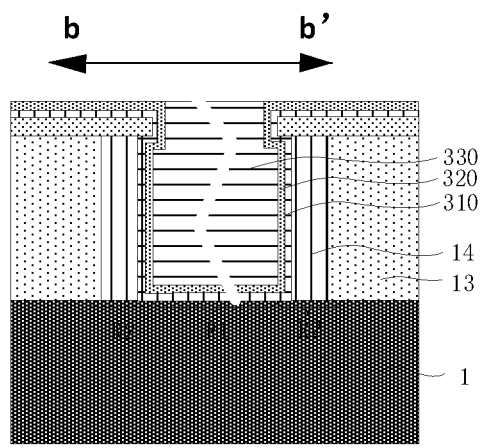
Figure 20D:
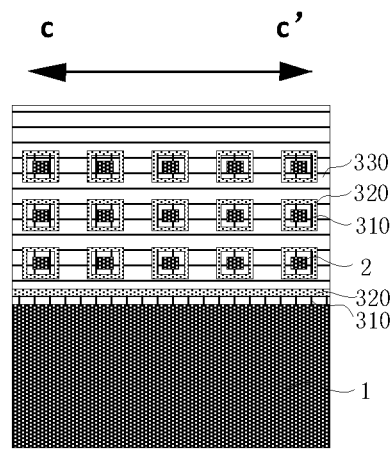
Figure 21A:
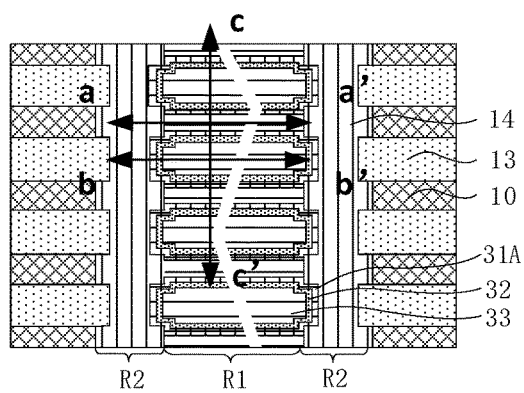
Figure 21B:
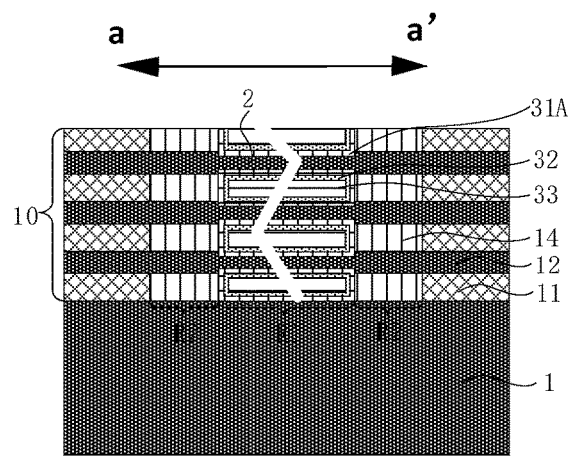
Figure 21C:
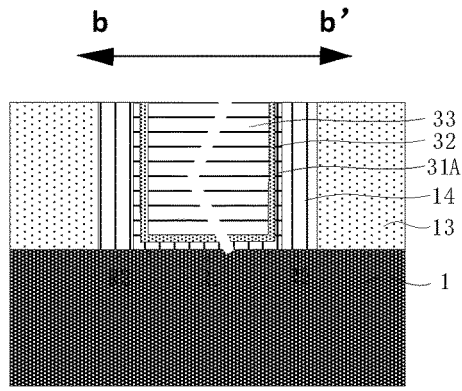
Figure 21D:
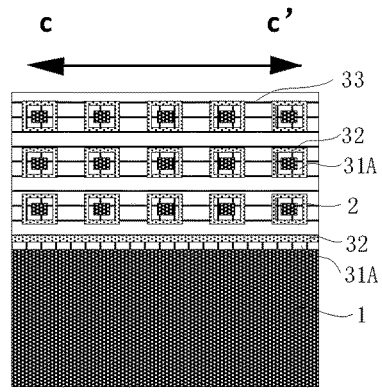
Figure 22A:
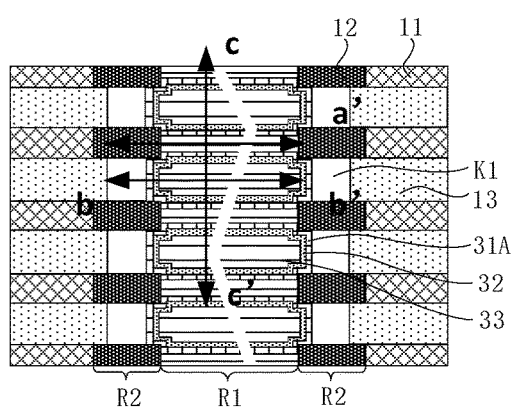
Figure 22B:
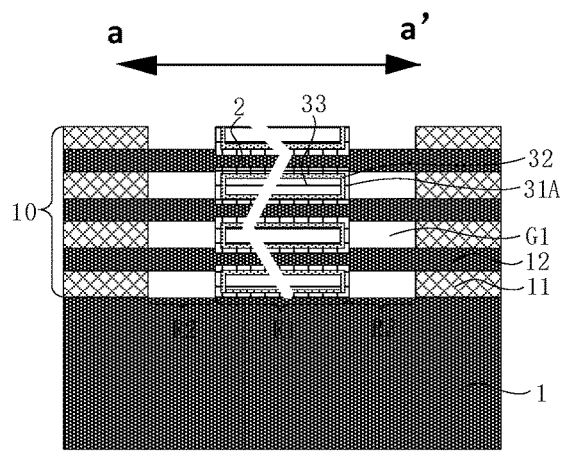
Figure 22C:
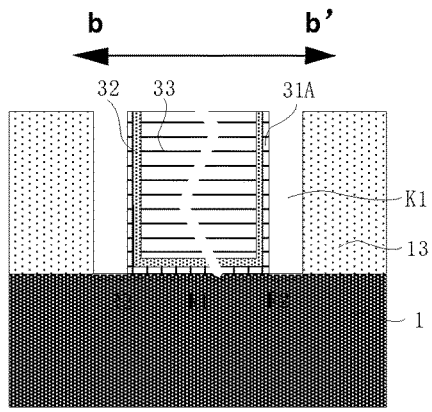
Figure 22D:
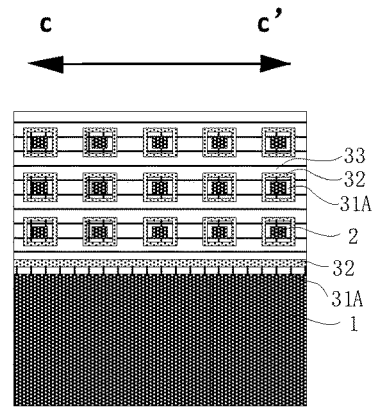

In addition, in some possible embodiments, it is to be understood with reference to FIG. 18C, the first electrode material layers 310 formed in Step S410 also cover the surface of the substrate 1 exposed in the first regions R1. On this basis, with continued reference to FIG. 23B and FIG. 23D, Step S440 of based on the first openings K1 and the first accommodating grooves G1, removing side walls of the first electrode material layers 310 to form the first electrodes 31 in one-to-one correspondence to the capacitor support structures 2 further includes: simultaneously forming first electrodes 31 positioned on the substrate 1.

Figure 23A:
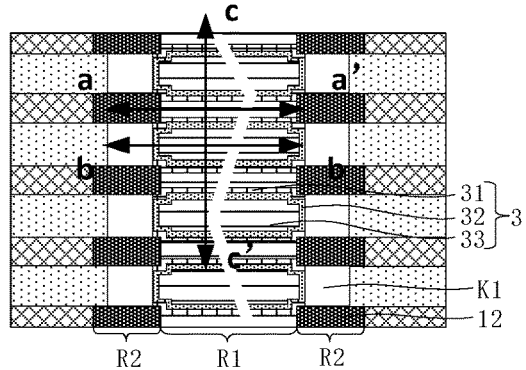
Figure 23B:
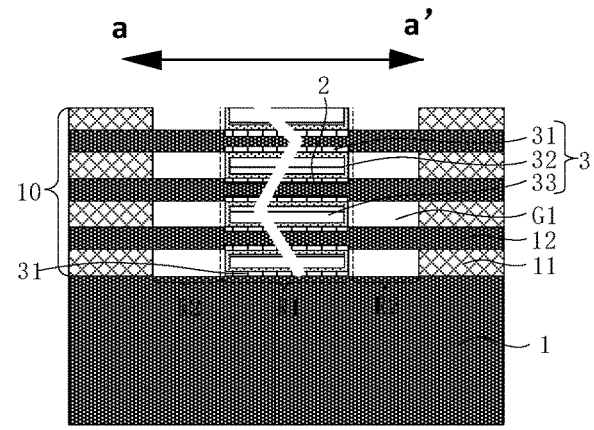
Figure 23C:
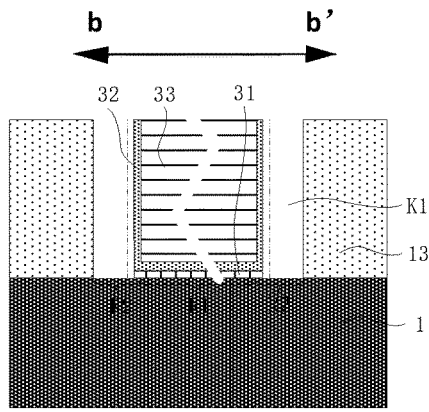
Figure 23D:
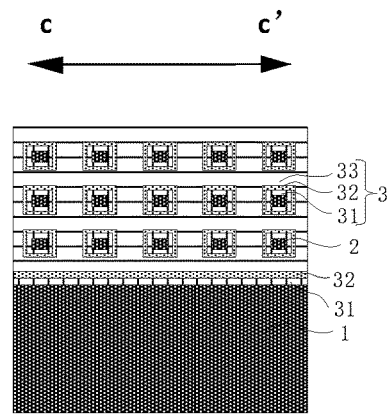
Figure 24A:
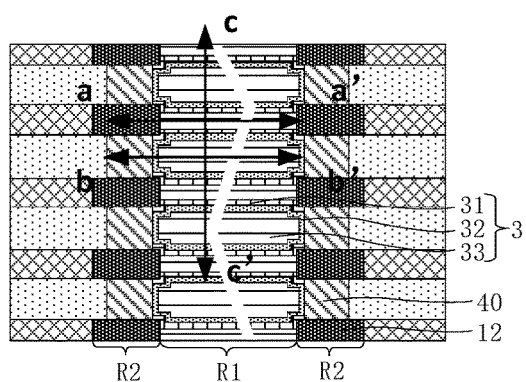
Figure 24B:
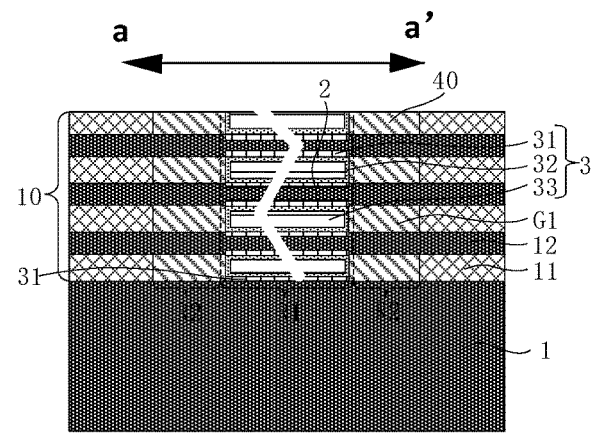
Figure 24C:
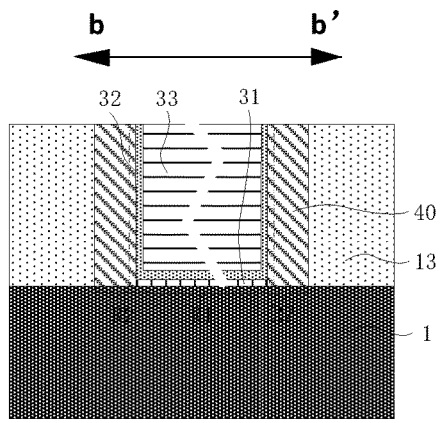
Figure 24D:
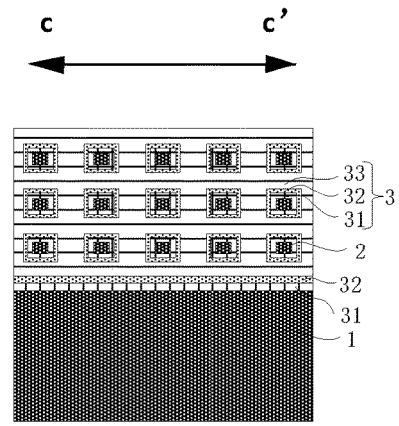

Correspondingly, with continued reference to FIG. 18C, FIG. 23B, and FIG. 23D, dielectric layers 32 are simultaneously formed on upper surfaces of the first electrode material layers 310 covering an inner surface of the substrate 1 exposed in the first regions R1. In this way, the first electrodes 31 positioned on the substrate 1 and the dielectric layers 32 covering the first electrodes 31 may also form the capacitors together with the second electrodes 33 above the aforementioned dielectric layers 32. In some embodiments, the first electrodes 31 positioned on the substrate 1 may also serve as other electrical functions.

It is to be understood that after the first electrodes 31 are formed in Step S440, the fabrication of the capacitors 3 is basically completed. In some embodiments, referring to FIGS. 24A to 24D, Step S400 further includes: depositing an insulating material 40 on a structure obtained after forming the first electrodes 31, such that the insulating material 40 fills the first openings K1 and the first accommodating grooves G1 and covers the exposed side walls of each capacitor 3. Herein, the insulating material 40 may be configured to form the first interlayer dielectric layers 42 described in some of the foregoing embodiments. In some embodiments, Step S400 further includes: after forming the first electrodes 31, removing a part of each second semiconductor layer 12 positioned in the second region R2 on a side of the capacitor 3, such that an end of the capacitor support structure 2 and an end of the capacitor 3 along the horizontal direction are free ends. On this basis, the insulating material 40 is deposited, such that the insulating material 40 may form the isolation portions 41 and the first interlayer dielectric layers 42 described in some of the foregoing embodiments.

It should be supplemented that, in some possible embodiments, referring to FIG. after Step S440 is performed, the fabrication method further includes: S500, forming sources on a part of the second semiconductor layers positioned in at least one of the second regions, where the sources are correspondingly connected to the first electrodes.

Herein, it is to be understood with reference to FIG. 2 and FIG. 26, sources 52 are formed on a part of the second semiconductor layers 12 positioned in at least one second region R2. That is, the sources 52 may be formed on any sides of the capacitor support structures 2 along the extension direction thereof, to ensure that the sources 52 may be connected to the first electrodes 31 such that the side walls are opposite to each other.

In some embodiments, the sources 52 may be formed by doping a part of the second semiconductor layers 12 positioned in the second regions R2.

In some embodiments, the sources 52 may be formed by depositing the same conductive material as the first electrode 31.

In some embodiments, with continued reference to FIG. 25, the fabrication method further includes: S600, forming second isolation material layers, where the second isolation material layers cover the sources and fill the first openings and the first accommodating grooves.

Here, it is to be understood with reference to FIG. 2 and FIG. 26, the second isolation material layers 401 cover the sources 52 and fill the first openings K1 and the first accommodating grooves G1. The second isolation material layers 401 may be the same material as the insulating material 40 in some of the foregoing embodiments. In addition, the second isolation material layers 401 may be configured to form the first interlayer dielectric layers 42 in some of the foregoing embodiments.

In some possible embodiments, referring to FIG. 27, after Step S440 is performed, the fabrication method further includes following steps: S500', removing a first part of the second semiconductor layers positioned in one of the second regions, such that one end of each of the capacitor support structures is suspended, and fourth openings are formed in the second semiconductor layers; forming sources on a second part of the second semiconductor layers positioned in other one of the second regions; and S600', forming third isolation material layers. The third isolation material layers cover the sources and fill the first openings, the first accommodating grooves, and the fourth openings.

Herein, it is to be understood with reference to FIG. 2 and FIG. 28, the first part of the second semiconductor layers 12 positioned in one of the second regions R2 (such as the second region R2 positioned on a right side of the capacitor support structure 2) are removed, such that one end (such as a right end) of the capacitor support structure 2 is suspended, and fourth openings K4 are formed in the second semiconductor layers 12. The sources 52 are formed on the second part of the second semiconductor layers 12 positioned in another second region R2 (such as the second region R2 positioned on a left side of the capacitor support structure 2).

It is to be understood with reference to FIG. 2 and FIG. 29, third isolation material layers 402 are formed. The third isolation material layers 402 cover the sources 52 and fill the first openings K1, the first accommodating grooves G1, and the fourth openings K4. The third isolation material layers 402 may be the same material as the insulating material 40 in some of the foregoing embodiments. In addition, the third isolation material layers 402 may be configured to form the isolation portions 41 and the first interlayer dielectric layers 42 in some of the foregoing embodiments.

It is worth mentioning that, in some embodiments, referring to FIG. 30, the fabrication method further includes following steps: S710, removing a part of the first semiconductor layers positioned in the third regions in the cell structures, such that a part of the second semiconductor layers positioned in the third regions form the drain regions. The third region is positioned on a side of the second region facing away from the first region; and S720, forming drains in the drain regions.

Figures 31, 32:
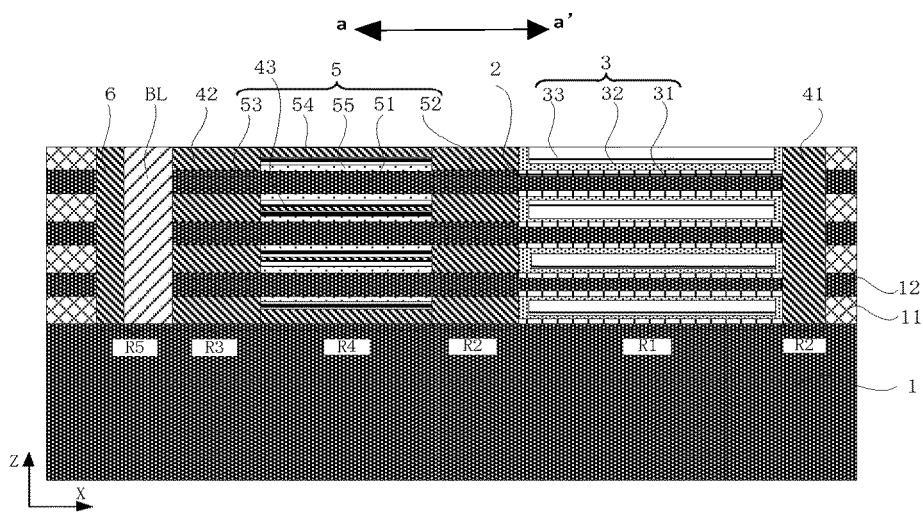
FIG. 31 is a schematic diagram of relative positions of regions in the fabrication method shown in FIG. 30.
FIG. 32 is a schematic flow diagram of a method for fabricating a drain region according to an embodiment.

Herein, it is to be understood with reference to FIG. 3 and FIG. 31, the part of the first semiconductor layers 11 positioned in the third regions R3 in the cell structures 10 are removed first, such that the part of the second semiconductor layers 12 positioned in the third regions R3 form the drains. The third regions R3 are positioned on sides of the second regions R2 facing away from the first regions R1, the second regions R2 refer to the second regions configured to form the sources 52, and there are spacings between the third regions R3 and the second regions R2. Next, the drains 53 may be formed in the drain regions.

It is to be understood that the removal of the part of the first semiconductor layers 11 positioned in the third regions R3 in the cell structures 10 may be performed simultaneously with the step of removing the part of the first semiconductor layers 11 positioned in the first regions R1 or second regions R2 described in some of the foregoing embodiments, and the removal may also be performed by means of etching after the capacitors 3 are formed.

In some embodiments, the sources 52 and the drains 53 in some of the above embodiments may also be formed by means of epitaxial growth and ion implantation.

It is worth mentioning that, in some embodiments, referring to FIG. 32, the fabrication method further includes following steps: S810, removing a part of the first semiconductor layers positioned in the fourth regions in the cell structures, such that a part of the second semiconductor layers positioned in the fourth regions form channel pillars of transistors, where the fourth regions are positioned between the third regions and the second regions; and S820, forming gates on the channel pillars.

Herein, it is to be understood with reference to FIG. 3 and FIG. 31, a part of the first semiconductor layers 11 positioned in the fourth regions R4 in the cell structures 10 are removed first, such that a part of the second semiconductor layers 12 positioned in the fourth regions R4 form channel pillars 51 of transistors 5, where the fourth regions R4 are positioned between the third regions R3 and the second regions R2. Next, gates 54 may be formed on the channel pillars 51, gate dielectric layers 55 may be formed between the channel pillars 51 and the gates 54, and second interlayer dielectric layers 43 may be formed between adjacent gates 54, etc.

It is to be understood that the removal of the part of the first semiconductor layers 11 positioned in the fourth regions R4 in the cell structures 10 may be performed simultaneously with the step of removing the part of the first semiconductor layers 11 positioned in the first regions R1 or second regions R2 described in some of the foregoing embodiments, and the removal may also be performed by means of etching after the capacitors 3 are formed.

In addition, the removal of the part of the first semiconductor layers 11 positioned in the fourth regions R4 in the cell structures 10 may be performed in the same or similar manner as in Step S300 in some of the foregoing embodiments. That is, the fourth regions R4 may be equivalently regarded as the first regions R1, to complete the etching or deposition of the corresponding materials to form the corresponding channel pillars 51, the gate dielectric layers 55, the gates 54, and the second interlayer dielectric layers 43.

It should be supplemented that, in some embodiments, it is to be understood with reference to FIG. 31, the fabrication method further includes: removing a part of the cell structures 10 positioned in fifth regions R5 to form bit line accommodating grooves; and then forming bit lines BL and side walls 6 in the bit line accommodating grooves. Herein, the fifth regions R5 are positioned on sides of the third regions R3 facing away from the fourth regions R4. The bit lines BL may extend along a direction perpendicular to the substrate 1 (i.e., the vertical direction), and the bit lines BL may be correspondingly connected to the drains 53 of the plurality of transistors 5 positioned in the same vertical direction. In addition, the bit lines BL may be insulated and isolated by means of the side walls 6 and other structures (such as the first semiconductor layers 11 and the second semiconductor layers 12).

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A method for fabricating a semiconductor structure comprising:

providing a substrate, wherein a semiconductor stacked structure formed by alternately stacking first semiconductor layers and second semiconductor layers is formed on the substrate;

patterning the semiconductor stacked structure to form a plurality of cell structures extending along a first direction and arranged at intervals;

removing a part of the first semiconductor layers positioned in first regions in the plurality of cell structures, such that a part of the second semiconductor layers positioned in the first regions form capacitor support structures; and forming capacitors on exposed surfaces of the capacitor support structures, the capacitors comprising first electrodes, dielectric layers and second electrodes sequentially stacked along a direction distant from the capacitor support structures; wherein all the capacitors in the first regions share a same one of the second electrodes;

wherein the removing a part of the first semiconductor layers positioned in first regions in the plurality of cell structures, such that a part of the second semiconductor layers positioned in the first regions form capacitor support structures comprises:

forming first isolation material layers in a spacing between adjacent two of the plurality of cell structures, and removing a part of the first isolation material layers positioned in second regions to form first openings in the first isolation material layers; wherein the second regions are respectively positioned on two opposite sides of the first regions, and boundaries of the second regions close to the first regions coincide with corresponding boundaries of the first regions;

based on the first openings, removing a part of the first semiconductor layers positioned in the second regions in the plurality of cell structures to form first accommodating grooves in the first semiconductor layers; and forming first support layers in the first openings and the first accommodating grooves;

wherein the removing a part of the first semiconductor layers positioned in first regions in the plurality of cell structures, such that a part of the second semiconductor layers positioned in the first regions form capacitor support structures further comprises:

forming hard masks on surfaces of the first support layers and a surface of the semiconductor stacked structure, wherein the hard masks have second openings;

based on the second openings, removing a part of the first isolation material layers positioned in the first regions to form third openings in the first isolation material layers; and based on the second openings and the third openings, removing a part of the first semiconductor layers positioned in the first regions in the plurality of cell structures, such that the part of the second semiconductor layers positioned in the first regions form the capacitor support structures, and form a plurality of second accommodating grooves positioned between adjacent two of the capacitor support structures;

wherein the based on the second openings and the third openings, removing a part of the first semiconductor layers positioned in the first regions in the plurality of cell structures, such that the part of the second semiconductor layers positioned in the first regions form the capacitor support structures, and form a plurality of second accommodating grooves positioned between adjacent two of the capacitor support structures further comprises:

after removing the part of the first semiconductor layers positioned in the first regions in the plurality of cell structures, etching the part of the second semiconductor layers positioned in the first regions to form columnar structures whose axes are parallel to the first direction, wherein the columnar structures are the capacitor support structures, and a space between adjacent two of the columnar structures serving as the plurality of second accommodating grooves.

2. The method according to claim 1, wherein radial sizes of the columnar structures in the first regions are smaller than sizes of the part of the second semiconductor layers positioned in the second regions in the same direction.

3. The method according to claim 1, further comprising:
etching the part of the second semiconductor layers positioned in the first regions, to form two of the capacitor support structures arranged at intervals in a same one of the second semiconductor layers.

4. The method according to claim 1, wherein the forming capacitors on exposed surfaces of the capacitor support structures comprises:
forming first electrode material layers, wherein the first electrode material layers cover the exposed surfaces of the capacitor support structures and exposed side walls of the first support layers;
forming dielectric layers covering the first electrode material layers;
forming second electrodes covering the dielectric layers and filling the plurality of second accommodating grooves and the third openings;
removing the first support layers; and
based on the first openings and the first accommodating grooves, removing side walls of the first electrode material layers to form the first electrodes in one-to-one correspondence to the capacitor support structures.

5. The method according to claim 4, wherein
the first electrode material layers further cover exposed surfaces of the hard masks; and
the forming dielectric layers covering the first electrode material layers, and forming second electrodes covering the dielectric layers and filling the plurality of second accommodating grooves and the third openings comprises:
forming dielectric material layers covering the first electrode material layers;
forming second electrode material layers covering the dielectric material layers and filling the plurality of second accommodating grooves and the third openings; and
polishing a structure obtained after forming the second electrode material layers, to remove the hard masks and form the second electrodes and the dielectric layers.

6. The method according to claim 5, wherein the second electrode material layers simultaneously fill the plurality of third openings and the plurality of second accommodating grooves positioned in a same one of the first regions.

7. The method according to claim 4, wherein the first electrode material layers further cover a surface of the substrate exposed in the first regions; and
the based on the first openings and the first accommodating grooves, removing side walls of the first electrode material layers to form the first electrodes in one-to-one correspondence to the capacitor support structures further comprises:
simultaneously forming first electrodes positioned on the substrate.

8. The method according to claim 4, wherein after the based on the first openings and the first accommodating grooves, removing side walls of the first electrode material layers to form the first electrodes in one-to-one correspondence to the capacitor support structures, the fabrication method further comprises:
forming sources on a part of the second semiconductor layers positioned in at least one of the second regions, wherein the sources are correspondingly connected to the first electrodes.

9. The method according to claim 8, wherein after the forming sources on a part of the second semiconductor layers positioned in at least one of the second regions, the fabrication method further comprises:
forming second isolation material layers, wherein the second isolation material layers cover the sources and fill the first openings and the first accommodating grooves.

10. The method according to claim 4, wherein after the based on the first openings and the first accommodating grooves, removing side walls of the first electrode material layers to form the first electrodes in one-to-one correspondence to the capacitor support structures, the fabrication method further comprises:
removing a first part of the second semiconductor layers positioned in one of the second regions, such that one end of each of the capacitor support structures is suspended, and fourth openings are formed in the second semiconductor layers;
forming sources on a second part of the second semiconductor layers positioned in other one of the second regions; and
forming third isolation material layers, wherein the third isolation material layers cover the sources and fill the first openings, the first accommodating grooves, and the fourth openings.

11. The method according to claim 1, further comprising:
removing a part of the first semiconductor layers positioned in third regions in the plurality of cell structures, such that a part of the second semiconductor layers positioned in the third regions form drain regions, wherein the third regions are positioned on sides of the second regions facing away from the first regions; and
forming drains in the drain regions.

12. The method according to claim 11, further comprising:
removing a part of the first semiconductor layers positioned in fourth regions in the plurality of cell structures, such that a part of the second semiconductor layers positioned in the fourth regions form channel pillars of transistors, wherein the fourth regions are positioned between the third regions and the second regions; and
forming gates on the channel pillars.

* * * * *